US007442491B2

(12) United States Patent
Sawada et al.

(10) Patent No.: US 7,442,491 B2
(45) Date of Patent: Oct. 28, 2008

(54) ALUMINUM ALLOY BLANK FOR LITHOGRAPHIC PRINTING PLATE AND SUPPORT FOR LITHOGRAPHIC PRINTING PLATE

(75) Inventors: Hirokazu Sawada, Shizuoka (JP); Akio Uesugi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/081,837

(22) Filed: Mar. 17, 2005

(65) Prior Publication Data

US 2006/0210926 A1 Sep. 21, 2006

(51) Int. Cl.
*G03F 7/09* (2006.01)
*C22C 21/02* (2006.01)
*C22C 21/04* (2006.01)

(52) U.S. Cl. ................. 430/272.1; 430/278.1; 148/437; 148/438; 420/537; 420/548; 428/650

(58) Field of Classification Search ............. 430/270.1, 430/278.1, 272.1; 148/437, 438; 420/537, 420/548; 428/650
See application file for complete search history.

(56) References Cited

U.S. PATENT DOCUMENTS 4,729,939 A * 3/1988 Nishikawa et al. ....... 430/278.1
5,076,899 A * 12/1991 Sakaki et al. ............ 430/278.1
6,337,136 B1 * 1/2002 Suzuki et al. ............... 428/472
2002/0029710 A1 * 3/2002 Sawada et al. ........... 101/463.1
2002/0056648 A1 * 5/2002 Sawada et al. .............. 205/219
2002/0160308 A1 * 10/2002 Nishino et al. ........... 430/271.1
2003/0124364 A1 * 7/2003 Sawada et al. ........... 428/472.2

FOREIGN PATENT DOCUMENTS

EP 0 581 321 A2 2/1994
EP 0 640 694 A1 3/1995
EP 640 694 A1 * 3/1995
EP 0 657 559 A1 6/1995
EP 0 672 759 A1 9/1995
EP 0 978 573 A2 2/2000
EP 1 231 075 A2 8/2002
JP 3-11635 B2 2/1991
JP 6-073478 A 3/1994
JP 6-305271 A 11/1994
JP 7-173563 A 7/1995
JP 11-115340 A 4/1999
JP 2002-079770 A 3/2002
JP 2003-342659 A 3/2003

OTHER PUBLICATIONS

Derwent abstr. 2004-250712; abstact of JP 2003342659 published Dec. 3, 2003.*
European Search Report dated Jun. 4, 2007.

* cited by examiner

*Primary Examiner*—Richard Schilling
(74) *Attorney, Agent, or Firm*—Sughrue Mion, PLLC

(57) ABSTRACT

There is provided an aluminum alloy blank for a lithographic printing plate including iron in a range of 0.20 to 0.80 wt %; and the balance being aluminum, a crystal grain refining element, and unavoidable impurity elements. The unavoidable impurity elements may include silicon and copper, wherein a content of silicon is in a range of 0.02 to 0.30 wt % and a content of copper is equal to or below 0.05 wt %. A solid solution amount of silicon is in a range of 150 ppm to 1500 ppm.

7 Claims, 3 Drawing Sheets

ALUMINUM ALLOY BLANK FOR LITHOGRAPHIC PRINTING PLATE AND SUPPORT FOR LITHOGRAPHIC PRINTING PLATE

BACKGROUND OF THE INVENTION

The present invention relates to an aluminum alloy blank for a lithographic printing plate and an aluminum alloy support for a lithographic printing plate having excellent electrochemical surface roughening properties, and to manufacturing methods thereof.

Presensitized plates including supports made of aluminum plates are widely used in offset printing.

In general, a flat-rolled plate having a thickness of 0.1 to 0.5 mm has been conventionally applied to an aluminum alloy blank for use in a support for a lithographic printing plate.

JIS 1000 series materials and JIS 3000 series materials are frequently applied to Al materials used herein.

A typical method conventionally used for manufacturing such an aluminum alloy flat-rolled plate includes the steps of polishing and removing surfaces of an ingot obtained by semicontinuous casting (direct chill (DC) casting), subjecting the ingot to a homogenization treatment as appropriate, performing hot rolling at given temperature, performing a heat treatment called intermediate annealing either after performing the hot rolling or in mid-course of performing cold rolling, and then performing final cold rolling.

Generally, a typical method known for manufacturing a presensitized plate includes the steps of obtaining a support for a lithographic printing plate by subjecting a surface of a sheet-type or coil-type aluminum plate to a surface roughening treatment and an anodic oxidation treatment, then forming an image recording layer by coating a photosensitive solution on this support and drying the photosensitive solution, and cutting the support into desired sizes as appropriate. After printing an image, this presensitized plate is subjected to development and formed into a lithographic printing plate.

In this method, a surface roughening treatment electrochemically performed in an acidic solution (hereinafter referred to as an "electrolytic surface roughening treatment" in this specification) is effective in order to improve adhesion of the image recording layer to the support. Alternatively, it is also effective to perform a surface treatment or to coat an undercoating solution after the anodic oxidation treatment.

When performing the surface roughening treatment including the electrolytic surface roughening treatment, minute irregularities (pits) are formed on the surface of the support. It has been conventionally considered that, by rendering diameters of the pits uniform and large or rendering depths of the pits smaller, adhesion between the recording layer and the support at an image area was strengthened and the recording layer was not peeled off even after printing numerous sheets; meanwhile, a non-image area could hold a large quantity of a fountain solution on a surface and stains hardly occur. In this way, it has been considered possible to obtain a presensitized plate which has excellent print quality. Methods for improving shapes and uniformity of electrolytically surface roughened pits from the above-mentioned viewpoints have been disclosed in JP 2000-108534 A, JP 2000-37965 A and JP 2000-37964 A, for example.

However, these methods are studied on materials having high Al purities and are therefore inapplicable to Al materials having high degrees of alloy components.

For an application to materials having high degrees of alloy components, claim 1 of JP 7-173563 A (corresponding to EP 0640694 A) discloses an electrolytically surface roughened aluminum alloy blank for a lithographic printing plate having an excellent electrolytic surface roughening property, which is a continuously cast flat-rolled aluminum alloy plate containing 0.20 to 0.80 wt % of Fe, and the balance being aluminum, crystal grain refining elements, and unavoidable impurity elements. Here, among the impurity elements, a content of Si is equal to or below 0.3 wt % and a content of Cu is equal to or below 0.05 wt %. Moreover, a solid solution amount of Fe is equal to or below 250 ppm, a solid solution amount of Si is equal to or below 150 ppm and a solid solution amount of Cu is equal to or below 120 ppm.

However, the alloy component elements include those which are solid solved in Al, those which are deposited as metal components, and those which exist as intermetallic compounds, and the amounts of the intermetallic compounds must be equal to or below given amounts. Accordingly, maintaining the low solid solution amounts of Fe, Si, and Cu as in this technique increases the deposited components and thereby causes disadvantages such as deterioration in resistance to aggressive ink stains. Further, it is difficult to maintain the low solid solution amounts while uniformly and finely crystallizing second phase grains. Here, the "aggressive ink stains" are stains of dot or annular shapes appearing on a printed sheet and the like, which are attributable to the ink attached more frequently to a non-image surface area of a lithographic printing plate as a result of several interruptions in the course of printing.

Meanwhile, there is other related art which discloses a lithographic printing plate having excellent handling characteristics in which a direction of rolling of an aluminum flat-rolled plate can be easily determined (JP 2002-79770 A).

Both ends of the lithographic printing plate are bent after the plate making process for forming the image thereon. Then, the lithographic printing plate is attached mechanically to a plate cylinder of a press. As the press continues printing with the lithographic printing plate, the fixing parts may be deformed or broken, and thereby causing printing defects such as misalignment. Otherwise, the bent portions may crack (hereinafter referred to as "corner cracks") and preclude printing any longer. Correspondingly, there has been disclosed a technique for improving resistance of an aluminum plate to metal fatigue by controlling alloy contents within specified ranges (JP 3-11635 B). However, an aluminum plate exhibits different strength properties between the rolling direction and the orthogonal direction thereto. Even though the above-mentioned problem may be usually avoided by this technique, however, if a lithographic printing plate made of such an alloy is used in the wrong orientation (i.e., by 90°) in the course of the plate making process or attachment to the press, the lithographic printing plate may be bent in the fragile orientation along the rolling direction. The lithographic printing plate thus attached to the press may crack similarly. Therefore, there is a demand for a lithographic printing plate which can avoid misrecognition of the orientation in the course of the plate making process or attachment to the press.

Meanwhile, numerous methods have been disclosed in order to provide numbers, characters, patterns, designs, and the like on a surface of a lithographic printing plate on an opposite side of a surface coated with a photosensitive layer. For example, JP 7-76800 A and JP 6-286352 A disclose a method of performing an electrochemical surface roughening treatment on a surface of a support for a lithographic printing plate without provision of a photosensitive layer (such a surface will be herein after referred to as a "rear surface", which may be also applied to a relevant surface of a lithographic printing plate similarly). JP 7-205563 A discloses a method of performing an alkali etching treatment on the rear surface of a support for a lithographic printing plate. JP 6-305271 A and the like disclose a method of performing a press treatment on the rear surface of a support for a lithographic printing plate by use of a transfer roller. Meanwhile, JP 6-73478 A discloses a method of providing an aluminum alloy plate with discontinuous patterns in certain colors by use of an anodic oxidation treatment. Nevertheless, all these methods entails the treatment process such as the electrochemical surface roughening treatment, the alkali etching treatment, the press treatment using the transfer roller, or the anodic oxidation treatment. As a result, fabrication of the lithographic printing plate provided with provision of the numbers, characters, patterns, designs, and the like on the rear surface according to any of these methods would incur an unfavorable process increase.

According to the related art, it has not been possible to obtain a support for a lithographic printing plate from an Al plate having high contents of alloy component elements, which has a uniform electrolytically roughened surface and allows simplification of manufacturing processes and reduction in manufacturing costs and manufacturing time.

SUMMARY OF THE INVENTION

Therefore, an object of the present invention is to provide a continuously cast flat-rolled aluminum alloy blank which can achieve a lithographic printing plate having a uniform electrolytically roughened surface and excellent press life. Another object of the present invention is to provide an aluminum alloy blank which can simplify manufacturing processes and reduce manufacturing costs and manufacturing time. Still another object of the present invention is to provide a support for a lithographic printing plate which can achieve a lithographic printing plate having excellent press life and stain resistance.

Still another object of the present invention is to provide a lithographic printing plate which is easy to use without misrecognition of an orientation of the plate in the course of a plate making process or attachment to a press, in addition, capable of suppressing the number of manufacturing steps.

The present invention provides the following aluminum alloy blanks which are suitable for electrolytic surface roughening.

(1) An aluminum alloy blank for a lithographic printing plate made of a continuously cast flat-rolled aluminum alloy plate including Fe in a range of 0.20 to 0.80 wt %, and the balance being aluminum, a crystal grain refining element, and unavoidable impurity elements. Here, among the impurity elements, a content of Si is in a range of 0.02 to 0.30 wt % and a content of Cu is equal to or below 0.05 wt %. Moreover, a solid solution amount of Si is in a range of 150 ppm to 1500 ppm inclusive.

(2) Preferably, the aluminum alloy blank for a lithographic printing plate in which a solid solution amount of Fe is in a range of 250 ppm to 4000 ppm inclusive.

(3) Preferably, the aluminum alloy blank for a lithographic printing plate in which a solid solution amount of Cu is in a range of 100 ppm to 500 ppm inclusive.

(4) Preferably, the aluminum alloy blank for a lithographic printing plate having resistivity in a range of 6.5 to 3.5 μΩmm when measured at liquid nitrogen temperature.

The present invention also provides the following.

(5) A support for a lithographic printing plate formed by performing a surface roughening treatment including an electrochemical surface roughening on an aluminum alloy blank for a lithographic printing plate according to any one of (1) to (4) described above.

(6) The support for a lithographic printing plate according to (5) described above, in which the surface roughening treatment including the electrochemical surface roughening has processes of performing the electrochemical surface roughening at a current density of 5 A/$dm^2$ or higher and then chemically dissolving not less than 0.1 g/$m^2$ of Al.

(7) The support for a lithographic printing plate according to (6) described above, in which the electrochemical surface roughening treatment is a treatment using an alternating current having a trapezoidal waveform in an electrolytic solution containing nitric acid.

(8) The support for a lithographic printing plate according to (6) described above, in which the electrochemical surface roughening treatment is a treatment using an alternating current having a sinusoidal waveform in an electrolytic solution containing hydrochloric acid.

(9) The support for a lithographic printing plate according to any one of (5) to (8) described above, in which the surface roughening treatment including the electrochemical surface roughening has processes of performing a first electrochemical surface roughening treatment using a total quantity of electricity in a range of 65 to 500 C/$dm^2$ upon an anodic reaction in an electrolytic solution containing nitric acid, chemically dissolving not less than 0.1 g/$m^2$ of Al, performing a second electrochemical surface roughening treatment using a total quantity of electricity in a range of 25 to 100 C/$dm^2$ upon an anodic reaction in an electrolytic solution containing hydrochloric acid, and then chemically dissolving not less than 0.03 g/$m^2$ of Al.

The prevent invention also provides the following presensitized plates.

(10) A presensitized plate including a recording layer on one surface of the support for a lithographic printing plate according to any one of (5) to (9) described above.

(11) A presensitized plate including a recording layer on one surface of the support for a lithographic printing plate according to any one of (5) to (9) described above, and any of a woodgrain pattern and a stripe pattern on the other surface thereof.

Moreover, the present invention provides a lithographic printing plate including the support for a lithographic printing plate of the aspect (5), in which one surface of an aluminum flat-rolled plate obtained by twin roll continuous casting and cold rolling is at least subjected to a surface roughening treatment, and the other surface thereof is subjected to an alkali etching treatment and a desmutting treatment to obtain a woodgrain pattern.

Furthermore, the present invention provides a lithographic printing plate including the support for a lithographic printing plate of the aspect (5), in which one surface of an aluminum flat-rolled plate obtained by twin belt continuous casting, hot rolling, and cold rolling is at least subjected to a surface roughening treatment, and the other surface thereof is subjected to an alkali etching treatment and a desmutting treatment to obtain a striped pattern.

The aluminum alloy blank for a lithographic printing plate of the present invention achieves a uniform electrolytically roughened surface after undergoing the electrochemical surface roughening treatment, and an excellent support for a lithographic printing plate is obtained therefrom. When a presensitized plate is formed by use of this support for a lithographic printing plate, such a presensitized plate has excellent quality such as excellent press life.

Moreover, a method of manufacturing the aluminum alloy blank for a lithographic printing plate of the present invention which can be formed into such an excellent presensitized plate has more simplified manufacturing processes as compared to a conventional method and advantages such as possibilities to reduce manufacturing costs and time. Accordingly, industrial contribution of the present invention is immense.

Japanese patent application No. 2003-327515, the entire contents of which are hereby incorporated by reference. In addition, the entire contents of literatures cited in this specification are incorporated by reference.

DETAILED DESCRIPTION OF THE PREFERRED EMBODIMENTS

Figure 1:
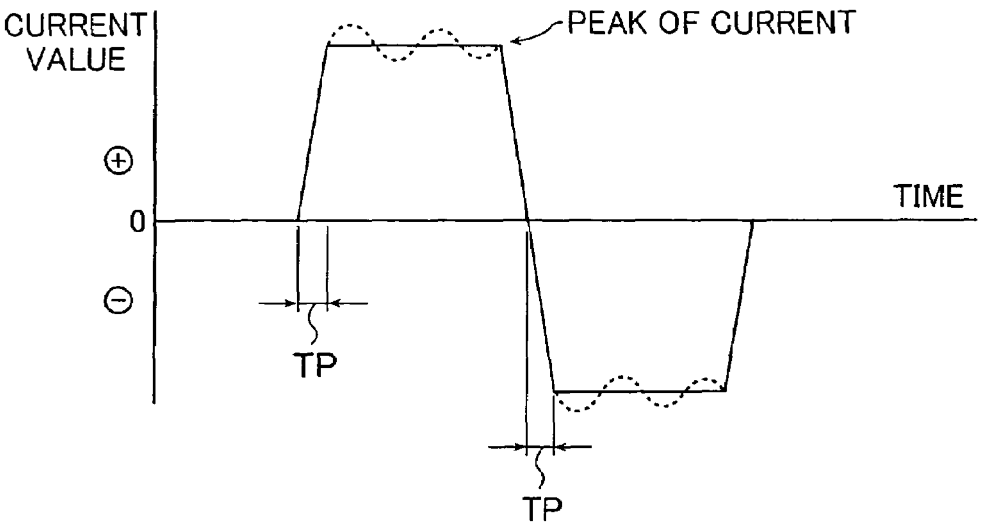
FIG. 1 is a graph showing an example of an alternating current waveform chart used for an electrochemical surface roughening treatment in a method of manufacturing a support for a lithographic printing plate of the present invention.

Now, the present invention will be described below in detail.

(Support for lithographic printing plate)

<Aluminum alloy blank (flat-rolled aluminum)>

An aluminum alloy blank of the present invention to be described below is used for a support for a lithographic printing plate of the present invention. Essential alloy components of the aluminum alloy are Al and Fe. The aluminum alloy may contain Si and Cu as impurities.

Si is an element contained by 0.03 to 0.1 wt % as an avoidable impurity in Al bare metal which is a raw material. A small amount of Si is often added intentionally so as to avoid unevenness among raw materials. Si exists in aluminum in a state of a solid solution, or exists as a deposit of an intermetallic compound or Si alone.

In this specification, the Si amount as the alloy component is in a range of 0.02 to 0.30 wt %, and Si in a specified amount thereof is in the state of a solid solution. Si influences an electrolytic surface roughening treatment. The inventors of the present invention focused particularly on the solid solution amount and have found out the following fact. Specifically, when subjecting an aluminum alloy substrate formed by continuous casting to electrochemical surface roughening, keeping the solid solution amount of Si equal to or above a certain amount leads to an excellent effect on stability of the electrolytic surface roughening. It is possible to stabilize the electrolytic surface roughening treatment by setting the Si content in the range of 0.02 to 0.30 wt % and the Si solid solution amount in a range of 150 ppm to 1500 ppm inclusive.

The reason for setting the Si content equal to or below 0.30 wt % is that uniformity in the electrolytic surface roughening is damaged by excessive Si. Moreover, when Si is excessive, elemental Si is relatively increased. In such a case, the elemental Si may cause defects on an anodized film when performing an anodic oxidation treatment after the surface roughening treatment. Water retentivity is deteriorated in such defective portions, and paper tends to be stained in the course of printing.

In the present invention, the Si solid solution amount is in the range of 150 ppm to 1500 ppm inclusive from the viewpoint of excellent stability of the electrolytic surface roughening treatment. Preferably, the Si solid solution amount is in a range of 300 ppm to 1300 ppm inclusive.

Fe is scarcely solid dissolved in aluminum, and most of Fe remains as intermetallic compounds. Fe has an effect to increase mechanical strength of the aluminum alloy and significantly influences the strength of the support. If the Fe content is too small, a lithographic printing plate tends to be broken because of its fairly low mechanical strength when the lithographic printing plate is fitted to a plate cylinder of a printing machine. Further, the lithographic printing plate tends to be broken similarly when printing a large number of copies at high speed. On the contrary, when the Fe content is excessive, the lithographic printing plate has unnecessarily high strength and lacks a fitness property when the lithographic printing plate is fitted to the plate cylinder of the printing machine. Accordingly, the lithographic printing plate tends to be broken in the course of printing. Meanwhile, when the Fe content exceeds 1.0 wt %, for example, a crack tends to occur in the course of rolling. The aluminum blank of the present invention has the Fe content in a range of 0.20 to 0.80 wt %.

Fe also influences the electrolytic surface roughening treatment. The inventors of the present invention have found out that it is preferable to keep a Fe solid solution amount equal to or above a certain value as well as to keep the Si solid solution amount equal to or above a certain value when subjecting the aluminum alloy substrate formed by continuous casting to the electrochemical surface roughening. It is possible to stabilize an electrolytic property by setting the Fe content in the range of 0.20 to 0.80 wt % and the Fe solid solution amount in a range of 250 ppm to 4000 ppm inclusive.

The reason for setting the Fe content equal to or above 0.20 wt % is that, if the Fe content is too small, the lithographic printing plate tends to be broken because of its fairly low mechanical strength when the lithographic printing plate is fitted to the plate cylinder of the printing machine as described above. It is also because the lithographic printing plate tends to be broken similarly when printing a large number of copies at high speed. The reason for setting the Fe content equal to or below 0.80 wt % is that, if the Fe content is excessive, the lithographic printing plate has unnecessarily high strength and lacks the fitness property when the lithographic printing plate is fitted to the plate cylinder of the printing machine, and that the lithographic printing plate tends to be broken in the course of printing. Preferably, the Fe content is in a range of 0.20 to 0.50 wt %.

In the present invention, the Fe solid solution amount is in the range of 250 ppm to 4000 ppm inclusive from the viewpoint of excellent stability of the electrolytic surface roughening treatment. Preferably, the Fe solid solution amount is in a range of 300 ppm to 1300 ppm inclusive.

Cu is an important element in terms of controlling the electrolytic surface roughening treatment. Cu is the element which is solid dissolved very easily, and a part of the element is formed into intermetallic compounds. Since Cu has a favorable character in terms of uniform electrolytic surface roughening, it is preferable to contain not less than 0.001 wt % of Cu.

When the Cu content exceeds 0.050 wt %, the diameters of pits formed by an electrolytic surface roughening treatment in a nitric acid solution become too large and uniformity of the diameters is reduced at the same time. Accordingly, stain resistance is particularly deteriorated in such a case.

Meanwhile, the inventors of the present invention have found out that it was possible to form uniform pits having diameters equal to or below 0.5 μm by an electrolytic surface roughening treatment in a hydrochloric acid solution and to maximize a rate of increase in a surface area of a support surface by setting the Cu content in the above-mentioned range. A contact area with an image recording layer can be enlarged by enlarging the rate of increase in the surface area. In this way, adhesion therebetween is improved, whereby press life and press life after cleaner application become excellent. Moreover, stain resistance becomes excellent when the aluminum alloy is formed into the lithographic printing plate. In the present invention, from the viewpoint described above, the Cu content is equal to or below 0.050 wt %, or preferably in a range of 0.001 to 0.030 wt %.

The Cu solid solution amount is preferably in a range of 100 ppm to 500 ppm inclusive.

Crystal grain refining elements may be added as appropriate in order to prevent occurrence of cracks in the course of casting. For this reason, Ti may be added in an amount of not more than 0.05 wt % and B may be added in an amount of not more than 0.02 wt %.

The balance of the aluminum plate includes Al and unavoidable impurities. The unavoidable impurities to be contained in the aluminum alloy may be Mg, Mn, Zn, Cr, Zr, V, and Be, for example. Each of these elements may be contained in an amount of not more than 0.05 wt %. A major part of the unavoidable impurities are contained in the Al base metal. The unavoidable impurities do not damage effects of the present invention as long as the unavoidable impurities are contained in the Al base metal having a purity of 99.7%, for example. Concerning the unavoidable impurities, impurities may be contained in amounts disclosed in "Aluminum Alloys: Structure and properties" (L. F. Mondolfo, 1976) and the like, for example.

The inventors of the present invention have performed various studies to solve the above-described problems of the related art and have found out that, by forming an aluminum alloy blank containing specified amounts of specified alloy elements into a continuously cast flat-rolled plate and by setting the Si solid solution amount to a specified value, it was possible to improve uniformity of an electrolytically roughened surface obtained when this blank was subjected to electrolytic surface roughening. If the solid solution amount exceeds an upper limit, large pits having diameters greater than 10 μm tend to be formed on the electrolytically roughened surface. Accordingly, the blank loses water retentivity and causes ink stains, whereby the press life is deteriorated upon printing.

Moreover, the inventors have found out that the above-described effect was preferably enhanced by setting one of the solid solution amounts of Fe and Cu or both to a specified value in addition to the Si solid solution amount.

Furthermore, the inventors have found out that it was possible to obtain appropriate values for the solid solution amounts of Si, Fe, and Cu in the blank by adjusting the temperature and time for heat treatment to appropriate values. In the present invention, it is preferable to apply the continuous casting and rolling method, to use a specified chemical composition and to set the solid solution amount of Si at a specified value in order to obtain the aluminum alloy blank suitable for the support for an electrolytically surface roughened lithographic printing plate.

A preferable method of manufacturing an aluminum alloy blank of the present invention will now be described below. However, the present invention is not limited only to the following method. The continuous casting and rolling can form fine and uniform crystals due to a high solidification rate on a surface of a cast material and requires no homogenizing heat treatment of an ingot which is essential in the DC casting method, and a long-term treatment is not performed. Therefore, the aluminum alloy blank is a suitable blank for use in the support because of its stable quality.

When forming the aluminum alloy into a plate member, it is possible to adopt the following method, for example. Firstly, aluminum alloy molten metal adjusted to given contents of alloy components is subjected to a cleaning treatment and then cast in accordance with a conventional method. As for the cleaning treatment, in order to remove unnecessary gas in the molten metal such as hydrogen, a flux treatment, a degasification treatment using argon gas, chlorine gas or the like, a filtering treatment using any of a so-called rigid media filter such as a ceramic tube filter or a ceramic foam filter, a filter applying alumina flakes or alumina balls as a filtering element, a glass cloth filter, and the like, or a combined treatment of the degasification treatment and the filtering treatment is performed.

It is preferable that these cleaning treatments be carried out to prevent the occurrence of defects attributable to foreign substance in the molten metal such as non-metal intermediates or oxides, and defects attributable to gas dissolved in the molten metal. Techniques related to filtering of molten metal are disclosed in various publications, namely, JP 6-57432 A, JP 3-162530 A, JP 5-140659 A, JP 4-231425 A, JP 4-276031 A, JP 5-311261 A, JP 6-136466, and the like. Meanwhile, techniques related to degasification of molten metal are disclosed in various publications, namely, JP 5-51659 A, JP 5-49148 U, and the like. The applicant of the present invention has also proposed a technique concerning degasification of molten metal in JP 7-40017 A.

Subsequently, casting is performed by use of the molten metal subjected to the cleaning treatment as described above. Casting methods include a method using a fixed mold as typified by the DC casting method, and a method using a mobile mold as typified by the continuous casting method. However, in the present invention, it is preferable to apply the continuous casting method using the mobile mold.

Industrially practiced continuous casting methods include methods using cooling rolls as typified by the twin roll method (the Hunter method) and the 3C method, and methods using cooling belts or cooling blocks as typified by the twin belt method (the Hazelett method) and the Alusuisse Caster II. When using the continuous casting method, solidification takes place at a cooling rate in a range of 100 to 1000° C./sec. In general, the continuous casting method has a higher cooling rate as compared to the DC casting method, and therefore has a characteristic that the continuous casting method can increase solid solubility of alloy components relative to an aluminum matrix. Concerning the continuous casting method, the applicant of the present invention has proposed techniques as disclosed in various publications, namely, JP 3-79798 A, JP 5-201166 A, JP 5-156414 A, JP 6-262203 A, JP 6-122949 A, JP 6-210406 A, JP 6-26308A, and the like.

In the case of performing the continuous casting, when the method using cooling rolls such as the Hunter method is applied, for example, various advantages are obtained such as a possibility to cast a plate in a plate thickness of 1 to 10 mm directly and continuously and a possibility to omit a hot rolling process. In the meantime, when the method using cooling belts such as the Hazelett method is applied, it is possible to cast a plate in a plate thickness of 10 to 50 mm. Generally, it is possible to obtain a plate in a plate thickness of 1 to 10 mm by arranging a hot rolling mill immediately after casting to perform rolling continuously.

These continuously cast flat-rolled plates are finished into a given thickness, such as a plate thickness of 0.1 to 0.5 mm, through processes such as cold rolling, intermediate annealing, and the like. An intermediate annealing treatment may be performed before, after, or in mid-course of the cold rolling. Conditions of the intermediate annealing treatment may be heating for 2 to 20 hours at 280° C. to 600° C. or preferably for 2 to 10 hours at 350° C. to 500° C. by use of a batch annealing furnace, or heating for 6 minutes or less at 400° C. to 600° C. or preferably for 2 minutes or less at 450° C. to 550° C. by use of a continuous annealing furnace. It is also possible to form fine crystalline structures by heating at a temperature rising rate of 10 to 200° C./sec with the continuous annealing furnace. Concerning the conditions for intermediate annealing and the conditions for cold rolling when using the continuous casting method, the applicant of the present invention has proposed techniques as disclosed in various publications, namely, JP 6-220593 A, JP 6-210308 A, JP 7-54111 A, and JP 8-92709.

The aluminum plate finished into the given thickness as in the range of 0.1 to 0.5 mm by the above-described processes may be further treated to improve the planarity by use of a reformation apparatus such as roller leveler or a tension leveler. Although it is possible to perform the improvement in planarity after cutting the aluminum plate into sheets, it is preferable to perform the improvement in planarity in a state of a continuous coil to enhance productivity. It is also possible to feed the aluminum plate into a slitter line so as to form the aluminum plate into a given plate width. Moreover, it is possible to provide thin oil films on surfaces of the aluminum plates to prevent occurrence of scratches due to friction between the aluminum plates. Such oil films may be volatile or nonvolatile as appropriate.

It is preferable that the aluminum plate used in the present invention be well-tempered in accordance with H18 as defined in JIS. When omitting the intermediate annealing, it is preferable that the aluminum plate be well-tempered in accordance with H19.

However, in the present invention, the solid solution amounts of the alloy elements such as Si are preferably adjusted to given values by performing a heat treatment by an intermediate annealing or a heat treatment after final cold rolling. In the present invention, the Si solid solution amount is adjusted in the range of 150 ppm to 1500 ppm inclusive. More preferably, the Fe solid solution amount is adjusted in the range of 250 ppm to 4000 ppm inclusive and the Cu solid solution amount is adjusted in the range of 100 ppm to 500 ppm inclusive.

An appropriate heat treatment is preferably performed in a temperature range of 300° C. to 600° C. The time for the heat treatment is preferably in a range of 5 hours to 20 hours. By conducting the heat treatment under such conditions, it is possible to adjust the solid solution amounts of Si, Fe, and Cu to desired values, and thereby to obtain an aluminum alloy blank for a lithographic printing plate which has uniform pits on an electrolytically roughened surface thereof.

The conditions of the heat treatment are preferably set in consideration of appropriate mechanical strength in an ultimately desired plate thickness. In addition, when cold rolling brings large distortion prior to the heat treatment, it is preferable to set the conditions appropriately in consideration of a decline in the Fe solid solution amount, for example.

The above-described heat treatment can be performed by use of a batch-type heat treatment furnace. In this case, a heating rate of a coil is equal to or below 100° C./hour. Although retention time at given temperature varies depending on that given temperature, the retention time becomes longer at lower temperatures and shorter at higher temperatures.

If the heat treatment is not conducted under appropriate conditions in mid-course of the cold rolling or after the final cold rolling, an electrolytically roughened surface fails to provide uniform pits and loses water retentivity. Such an electrolytic roughened surface causes ink stains and loses press life for printing.

Figure 5:
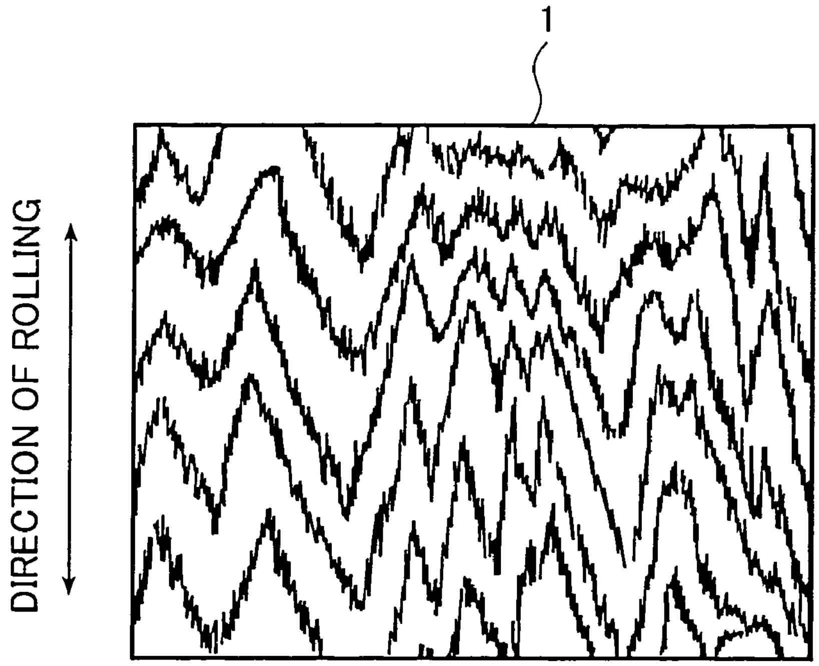
FIG. 5 is a view showing an example of the lithographic printing plate 1 of the present invention, which includes a woodgrain pattern on the rear surface thereof.
Figure 6:
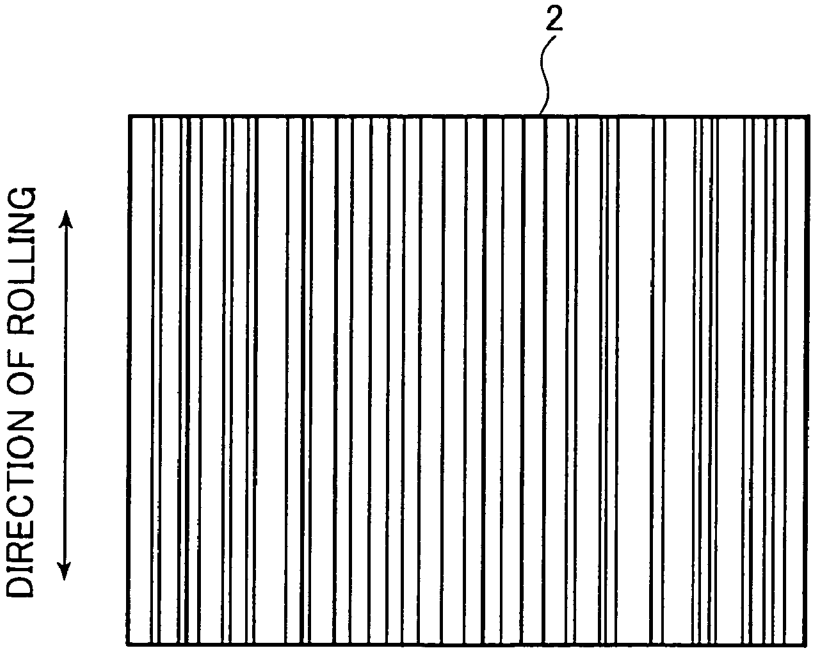
FIG. 6 is a view showing an example of the lithographic printing plate 2 of the present invention, which includes a striped pattern on the rear surface thereof.

In the present invention, an aluminum flat-rolled plate obtained by twin roll continuous casting and cold rolling, or an aluminum flat-rolled plate obtained by twin belt continuous casting, hot rolling, and cold rolling is preferably used. The surface treatment, to be described later, is at least performed on one surface of such an aluminum flat-rolled plate. Meanwhile, the other surface thereof is subjected to an alkali etching treatment and a desmutting treatment to obtain a woodgrain pattern. As shown in FIG. 5 and FIG. 6, the lithographic printing plate of the present invention includes either the woodgrain pattern or the striped pattern on the rear surface. Accordingly, it is very easy to distinguish the rolling direction of the applied aluminum flat-rolled plate based on a relation between the pattern and the rolling direction. Therefore, it is possible to eliminate misrecognition of the orientation of the lithographic printing plate in the course of the plate making process or attachment to the press. Accordingly, it is possible to avoid occurrence of corner cracks caused by bending the lithographic printing plate in the fragile orientation when attaching the plate to the press.

In addition, the present invention is particularly favorable from the viewpoint that the woodgrain pattern or the striped pattern on the rear surface can be obtained without a special treatment process but by performing the alkali etching treatment and the desmutting treatment on the surface provided with the photosensitive layer and on the rear surface at the same time.

<Mechanical surface roughening treatment>

In the method of manufacturing a support for a lithographic printing plate of the present invention, the above-described aluminum alloy blank is subjected to a surface treatment. In the surface treatment, it is possible to carry out a mechanical surface roughening treatment by use of a rolling brush and an abrasive to be described below. Alternatively, it is possible to carry out a treatment for forming irregularities on the surface by transcription at the end of the cold rolling.

Now, a brush graining method used as the mechanical surface roughening treatment will be described.

Generally, the brush graining method uses a roller brush implanted with numerous bristles such as synthetic resin bristles made of nylon (trademark), propylene or polyvinyl chloride resin onto a surface of a cylindrical drum, and the method is performed by scrubbing one or both surfaces of the aluminum plate while spraying a slurry solution containing an abrasive onto the rotating roller brush. Instead of the roller brush and the slurry solution, it is also possible to use an abrasive roller which is a roller provided with an abrasive layer on a surface thereof.

When using the roller brush, a bend elastic constant of bristles for use is preferably in a range of 10,000 to 40,000

$kg/cm^2$, or more preferably in a range of 15,000 to 35,000 $kg/cm^2$. In addition, elastic strength of the bristles is preferably equal to or below 500 g, or more preferably equal to or below 400 g. The diameter of each bristle is generally in a range of 0.2 to 0.9 mm. The length of each bristle can be appropriately determined in accordance with the outside diameter of the roller brush and the diameter of the drum. However, the length of each bristle is generally in a range of 10 to 100 mm.

In the present invention, it is preferable to use a plurality of nylon brushes. To be more precise, it is preferable to use three or more brushes, and is more preferable to use four or more brushes. By adjusting the number of brushes, it is possible to adjust wavelength components of cavities which are formed on the surface of the aluminum plate.

Meanwhile, the load of a drive motor for rotating the brush is preferably greater by at least 1 kW as compared to the load before pushing the brush roller against the aluminum plate. The difference in load is more preferably equal to or above 2 kW, and is even more preferably equal to or above 8 kW. By adjusting the load, it is possible to adjust depths of the cavities formed on the surface of the aluminum plate. The number of revolution per minute of the brush is preferably not less than 100 or more preferably not less than 200.

Publicly known abrasives can be used herein. For example, it is possible to use abrasives such as pumice stone, silica sand, aluminum hydroxide, alumina powder, silicon carbide, silicon nitride, volcanic ash, carborundum, or emery; and a combination thereof. Among these abrasives, pumice stone and silica sand are preferable. Silica sand is excellent in surface roughening efficiency because silica sand is harder and more durable than pumice stone. On the other hand, aluminum hydroxide grains crack upon application of an excessive load. Accordingly, aluminum hydroxide is suitable for preventing generation of locally deep cavities.

The median diameter of the abrasive is preferably in a range of 2 to 100 μm, or more preferably in a range of 20 to 60 μm, in terms of excellent surface roughening efficiency and a narrow graining pitch capability. By adjusting the median diameter of the abrasive, it is possible to adjust the depths of the cavities formed on the surface of the aluminum plate.

The abrasive is suspended in water, for example, and is used as the slurry solution. In addition to the abrasive, the slurry solution may contain a thickener, a dispersing agent (such as a surfactant), an antiseptic, and the like. The specific gravity of the slurry solution is preferably in a range of 0.5 to 2.

As an apparatus suitable for the mechanical surface roughening treatment, it is possible to cite an apparatus as disclosed in JP 50-40047 B, for example.

Concerning details of the apparatus for performing the mechanical surface roughening treatment with the brushes and the abrasive, it is possible to use a technique disclosed by the applicant of the present invention in JP 2002-211159 A.

In the present invention, it is possible to use an aluminum plate having a surface with irregular patterns formed by transcription instead of the mechanical surface roughening using the brushes and the abrasive. Alternatively, it is also possible to apply the both surface roughening techniques.

<Surface treatment>

In the method of manufacturing a support for a lithographic printing plate of the present invention, the support for a lithographic printing plate is obtained by subjecting the aluminum plate, which is provided with irregular patterns formed on the surface as described above, to the surface roughening treatment and an anodic oxidation treatment (these two treatments will be collectively referred to as the surface treatment in this present invention).

In the surface roughening treatment, it is preferable to perform electrochemical surface roughening treatment twice and to perform etching treatments in alkaline aqueous solutions in the course of the electrochemical surface roughening treatments. It is preferable to perform a (first) etching treatment in an alkaline aqueous solution, a (first) desmutting treatment in an acidic aqueous solution, an electrochemical surface roughening treatment (a first electrolytic treatment) in an aqueous solution containing nitric acid or hydrochloric acid, a (second) etching treatment in an alkaline aqueous solution, a (second) desmutting treatment in an acidic aqueous solution, an electrochemical surface roughening treatment (a second electrolytic treatment) in an aqueous solution containing hydrochloric acid, a (third) etching treatment in an alkaline aqueous solution, a (third) desmutting treatment in an acidic aqueous solution, and an anodic oxidation treatment in this order. It is also preferable to further perform a hydrophilic treatment after the anodic oxidation treatment.

It is more preferable to perform the mechanical surface roughening treatments before the electrochemical surface roughening treatments.

The method of manufacturing a support for a lithographic printing plate of the present invention may include other various processes in addition to the above-described processes.

Now, the respective processes of the surface treatment will be described in detail.

<First alkaline etching treatment>

The alkaline etching treatment is a treatment for dissolving a surface layer of the above-described aluminum plate by allowing the aluminum plate to contact an alkaline solution.

The first alkaline etching treatment, which is performed prior to the first electrolytic treatment, aims at smoothing irregular shapes and to form uniform cavities in the first electrolytic treatment when the mechanical surface roughening is performed, or aims at removing rolling oil, stains, a natural oxide film, and the like on the surface of the aluminum plate (flat-rolled aluminum) when the mechanical surface roughening is not performed.

In the first alkaline etching, the etching amount is preferably equal to or above 0.1 $g/m^2$, more preferably equal to or above 0.5 $g/m^2$, and even more preferably equal to or above 1 $g/m^2$. Meanwhile, the etching amount is preferably equal to or below 10 $g/m^2$, more preferably equal to or below 8 $g/m^2$, and even more preferably equal to or below 5 $g/m^2$. When the lower limit of the etching amount remains in the above-described ranges, it is possible to form uniform pits in the first electrolytic treatment and further to prevent occurrence of unevenness in the treatment. When the upper limit of the etching amount remains in the above-described range, the amount of the alkaline aqueous solution used therein is reduced, and it is therefore economically advantageous.

The alkali to be used in the alkaline solution may be caustic alkali and alkali metal salt. To be more precise, the caustic alkali includes caustic soda and caustic potash, for example. Meanwhile, the alkali metal salt includes, for example: alkali metal silicate such as sodium metasilicate, sodium silicate, potassium metasilicate, or a potassium silicate; alkali metal carbonate such as sodium carbonate or potassium carbonate; alkali metal aluminate such as sodium aluminate or potassium aluminate; alkali metal aldonate such as sodium gluconate or potassium gluconate; alkali metal hydrogenphosphate such as sodium secondary phosphate, potassium secondary phosphate, sodium primary phosphate, or potassium primary phosphate. Among these compounds, a caustic alkali solution and a solution containing both of caustic alkali and alkali metal aluminate are preferred in terms of a high etching rate and a low price. A caustic soda aqueous solution is preferred in particular.

In the first alkaline etching treatment, the concentration of the alkaline solution is preferably equal to or above 30 g/L or more preferably equal to or above 300 g/L. Meanwhile, the concentration of the alkaline solution is preferably equal to or below 500 g/L or more preferably equal to or below 450 g/L.

Moreover, it is preferable that the alkaline solution contain aluminum ions. The aluminum ion concentration is preferably equal to or above 1 g/L or more preferably equal to or above 50 g/L. Meanwhile, the aluminum ion concentration is preferably equal to or below 200 g/L or more preferably equal to or below 150 g/L. Such an alkaline solution can be prepared by use of water, a 48-wt % caustic soda aqueous solution, and sodium aluminate, for example.

In the first alkaline etching treatment, the temperature of the alkaline solution is preferably equal to or above 30° C. or more preferably equal to or above 50° C. Meanwhile, the temperature is preferably equal to or below 80° C. or more preferably equal to or below 75° C.

In the first alkaline etching treatment, the treating time is preferably equal to or above 1 second or more preferably equal to or above 2 seconds. Meanwhile, the treating time is preferably equal to or below 30 seconds or more preferably equal to or below 15 seconds.

When the aluminum plates are continuously subjected to the etching treatment, the aluminum ion concentration in the alkaline solution is increased and the etching amounts of the aluminum plates thereby vary. Accordingly, it is preferable to manage compositions of the etching solution as described below.

Specifically, either a matrix of conductivity, specific gravity and temperature, or a matrix of conductivity, propagation velocity of ultrasonic waves and temperature is formed in advance, each of the matrices corresponding to a matrix of caustic soda concentration and the aluminum ion concentration. Then, the compositions of the solution are measured in terms of the conductivity, the specific gravity and the temperature or in terms of the conductivity, the propagation velocity of ultrasonic waves and the temperature, and caustic soda and water are added thereto so as to achieve target control values for the compositions of the solution. Thereafter, the etching solution, which is increased in volume by adding caustic soda and water, is allowed to overflow from a circulation tank so as to maintain the constant volume. As for caustic soda for such addition, it is possible to use one for industrial use which contains 40 to 60 wt % therein.

A conductivity detector and a gravimeter used therein are preferably temperature compensated, respectively. Here, it is preferable to use a gravimeter of a differential pressure type.

The method of allowing the aluminum plate to contact the alkaline solution includes a method of allowing the aluminum plate to pass through a tank filled with the alkaline solution, a method of dipping the aluminum plate in a tank filled with the alkaline solution, and a method of spraying the alkaline solution on the surface of the aluminum plate.

Among these methods, the method of spraying the alkaline solution on the surface of the aluminum plate is preferred. To be more precise, it is preferable to apply the method of spraying the etching solution by using a spray tube provided with pores which have diameters in a range of 2 to 5 mm and are arranged with spaces in a range of 10 to 50 mm. Here, it is preferable to spray the etching solution in an amount of 10 to 100 L/min for each spray tube. A plurality of spray tubes are preferably provided therein.

After completing the alkaline etching treatment, it is preferable to drain the solution off with a nip roller, then to perform a water washing treatment for 1 to 10 seconds, and then to drain the water off with the nip roller.

The water washing treatment is preferably carried out by using an apparatus configured to perform a water washing treatment with a liquid film of a free-fall curtain shape, and then using the spray tubes.

The apparatus configured to perform a water washing treatment with a liquid film of a free-fall curtain shape includes a water storage tank for storing water, a water supply tube for supplying the water storage tank with water, and a flow controller unit for supplying a liquid film of a free-fall curtain shape from the water storage tank to the aluminum plate.

In this apparatus, water is supplied from the water supply tube and the water flow is controlled by the flow controller unit when the water overflows from the water storage tank, whereby the liquid film of the free-fall curtain shape is supplied to the aluminum plate. When using this apparatus, the fluid volume is preferably in a range of 10 to 100 L/min. Meanwhile, the distance L in which water exists as the liquid film of the free-fall curtain shape between the flow controller unit and the aluminum is preferably in a range of 20 to 50 mm. Furthermore, the angle α of the aluminum plate is preferably in a range of 30° to 80° relative to the horizontal direction.

By using the apparatus configured to perform a water washing treatment with a liquid film of a free-fall curtain shape, it is possible to perform the water washing treatment uniformly on the aluminum plate. Accordingly, it is possible to enhance uniformity of the treatments which are carried out prior to the water washing treatments.

The apparatus configured to perform a water washing treatment with a liquid film of a free-fall curtain shape may be preferably an apparatus disclosed in JP 2003-96584 A, for example.

Meanwhile, as the spray tube for use in the water washing treatment, it is possible to use a spray tube provided with a plurality of spray tips arranged along the width direction of the aluminum plate, which are configured to fan out injection water. The distance between the adjacent spray tips is preferably in a range of 20 to 100 mm, and the fluid volume for each spray tip is preferably in a range of 0.5 to 20 L/min. It is preferable to use a plurality of such spray tubes.

<First desmutting treatment>

After performing the first alkaline etching treatment, it is preferable to perform acid washing (a first desmutting treatment) in order to remove stains (smuts) remaining on the surface. The desmutting treatment is carried out by allowing the aluminum plate to contact an acidic solution.

Acids used herein include nitric acid, sulfuric acid, phosphoric acid, chromic acid, hydrofluoric acid, and fluoroboric acid, for example.

Here, in the first desmutting treatment to be carried out after the first alkaline etching treatment, if electrolysis in nitric acid is subsequently carried out as the first electrolytic treatment, then it is preferable to use overflow waste of an electrolytic solution used in the electrolysis in nitric acid.

Upon management of compositions of a desmutting solution, it is possible to select and use any of a method of management by conductivity and temperature corresponding to a matrix of concentration of the acidic solution and the aluminum ion concentration, a method of management by conductivity, specific gravity and temperature corresponding to the same, and a method of management by conductivity, propagation velocity of ultrasonic waves and temperature corresponding to the same.

In the first desmutting treatment, it is preferable to use the acidic solution containing an acid in a range of 1 to 400 g/L and aluminum ions in a range of 0.1 to 5 g/L.

Temperature of the acidic solution is preferably equal to or above 20° C., or more preferably equal to or above 30° C. Meanwhile, the temperature is preferably equal to or below 70° C., or more preferably equal to below 60° C.

In the first desmutting treatment, the treating time is preferably equal to or above 1 second, or more preferably equal to or above 4 seconds. Meanwhile, the treating time is preferably equal to or below 60 seconds, or more preferably equal to or below 40 seconds.

The method of allowing the aluminum plate to contact the acidic solution includes a method of allowing the aluminum plate to pass through a tank filled with the acidic solution, a method of dipping the aluminum plate in a tank filled with the acidic solution, and a method of spraying the acidic solution on the surface of the aluminum plate.

Among these methods, the method of spraying the acidic solution on the surface of the aluminum plate is preferred. To be more precise, it is preferable to apply the method of spraying the desmutting solution by using a spray tube provided with pores which have diameters in a range of 2 to 5 mm and are arranged with spaces in a range of 10 to 50 mm. Here, it is preferable to spray the desmutting solution in an amount of 10 to 100 L/min for each spray tube. A plurality of spray tubes are preferably provided therein.

After completing the desmutting treatment, it is preferable to drain the solution off with a nip roller, then to perform a water washing treatment for 1 to 10 seconds, and then to drain the water off with the nip roller.

The water washing treatment is similar to the water washing treatment which is carried out after the alkaline etching treatment. However, the fluid volume for each spray tip is preferably in a range of 1 to 20 L/min.

Here, in the first desmutting treatment, if the overflow waste of the electrolytic solution to be used in the subsequent electrolysis in nitric acid is used as the desmutting solution, then it is preferable to cancel draining with the nip roller and the water washing treatment after the desmutting treatment. Instead, it is preferable to handle the aluminum plate until the process of electrolysis in nitric acid while spraying the desmutting solution as appropriate to prevent the surface of the aluminum plate from drying.

<First electrolytic treatment>

The first electrolytic treatment is an electrochemical surface roughening treatment to be performed in an aqueous solution containing nitric acid or hydrochloric acid.

According to the present invention, it is possible to form grain shapes of superposition of highly uniform irregular structures on the surface of the aluminum plate by carrying out the first electrolytic treatment and the second electrolytic treatment in this order. In this way, it is possible to achieve excellent stain resistance and press life.

Here, average roughness Ra of the surface of the aluminum plate after the first electrolytic treatment is preferably in a range of 0.2 to 1.0 μm.

(First electrolytic treatment: when performing electrochemical surface roughening treatment in aqueous solution containing nitric acid)

By the electrochemical surface roughening treatment in the aqueous solution containing nitric acid (the electrolysis in nitric acid), it is possible to form favorable irregular structures on the surface of the aluminum plate. In the present invention, when the aluminum plate contains relatively a large amount of Cu, relatively large and uniform cavities are formed by the electrolysis in nitric acid. As a result, a lithographic printing plate using the support for a lithographic printing plate obtained by the present invention will have excellent press life.

The aqueous solution containing nitric acid usable herein may be one applicable to an electrochemical surface roughening treatment using a normal direct current or a normal alternating current. Here, it is possible to add at least one of nitrate compounds having nitrate ions, such as aluminum nitrate, sodium nitrate or ammonium nitrate, in a range of 1 g/L to a saturation level, to the aqueous solution containing nitric acid in a concentration of 1 to 100 g/L upon use. Moreover, metal contained in the aluminum alloy such as iron, copper, manganese, nickel, titanium, magnesium or silica may be dissolved in the aqueous solution containing nitric acid. It is also possible to add hypochlorous acid or hydrogen peroxide in an amount of 1 to 100 g/L.

To be more precise, it is preferable to use the solution prepared by dissolving aluminum nitrate in the nitric acid aqueous solution having the nitric acid concentration in a range of 5 to 15 g/L, so as to adjust the aluminum ion concentration to 3 to 7 g/L.

Temperature of the aqueous solution containing nitric acid is preferably in a range of 20° C. to 55° C. inclusive.

It is possible to form the pits having an average pore size in a range of 1 to 10 μm by means of the electrolysis in nitric acid. Note that an electrolytic reaction is condensed when a quantity of electricity is relatively higher, and honeycomb pits exceeding 10 μm are also generated.

To obtain such grains, a total quantity of electricity contributing to an anodic reaction of the aluminum plate at the point of termination of the electrolytic reaction is preferably equal to or above 150 $C/dm^2$, or more preferably equal to or above 170 $C/dm^2$. Meanwhile, the total quantity of electricity is preferably equal to or below 600 $C/dm^2$, or more preferably equal to or below 500 $C/dm^2$. Current density in this case is preferably in a range of 20 to 100 $A/dm^2$ in terms of a peak current value when using an alternating current, or in a range of 20 to 100 $A/dm^2$ when using a direct current.

(First electrolytic treatment: when performing electrochemical surface roughening treatment in aqueous solution containing hydrochloric acid)

The aqueous solution containing hydrochloric acid usable herein may be one applicable to an electrochemical surface roughening treatment using a normal direct current or a normal alternating current. Here, it is possible to add at least one of chloride or nitrate compounds including ones having nitrate ions such as aluminum nitrate, sodium nitrate or ammonium nitrate, and ones having chlorine ions such as aluminum chloride, sodium chloride or ammonium chloride in a range of 1 g/L to a saturation level to the aqueous solution containing hydrochloric acid in a concentration of 1 to 30 g/L or more preferably 2 to 10 g/L upon use. Moreover, it is possible to add a compound, which forms a complex with copper, in a proportion of 1 to 200 g/L. Metal contained in the aluminum alloy such as iron, copper, manganese, nickel, titanium, magnesium or silica may be dissolved in the aqueous solution containing hydrochloric acid. It is also possible to add hypochlorous acid or hydrogen peroxide in an amount of 1 to 100 g/L.

As for the aqueous hydrochloric acid solution, it is particularly preferable to prepare the aqueous solution by adding aluminum salt (aluminum chloride: $AlCl_3.6H_2O$) to an aqueous solution containing hydrochloric acid in a concentration of 2 to 10 g/L so as to adjust the aluminum ion concentration preferably in a range of 3 to 7 g/L or more preferably in a range of 4 to 6 g/L. When the electrochemical surface roughening treatment is carried out by use of the above-described aqueous hydrochloric acid solution, uniform surface shapes are obtained by the surface roughening treatment. Accordingly, unevenness does not occur in the surface roughening treatment regardless of whether a low-purity aluminum flat-rolled plate or a high-purity aluminum flat-rolled plate is used. As a result, it is possible to satisfy excellent press life and stain resistance when such an aluminum flat-rolled plate is formed into a lithographic printing plate.

Temperature of the aqueous solution containing hydrochloric acid is preferably equal to or above 20° C. or more preferably equal to or above 30° C. Meanwhile, the temperature is preferably equal to or below 55° C. or more preferably equal to or below 50° C.

Concerning additives for the aqueous solution containing hydrochloric acid, apparatuses, power sources, current density, flow rates, and temperature, it is possible to apply publicly known techniques for use in electrochemical surface roughening. Although both of an alternating current and a direct current are applicable to the power source used in electrochemical surface roughening, an alternating current is particularly preferred.

Hydrochloric acid itself possesses high aluminum dissolving power. Accordingly, it is possible to form fine irregularities on the surface only by applying a small current. Such fine irregularities have an average pore size in a range of 0.01 to 0.4 μm and are generated uniformly on the entire surface of the aluminum plate.

When the quantity of electricity is raised further (the total quantity of electricity (the anodic reaction) in a range of 150 to 2000 $C/dm^2$), larger pits having an average pore size in a range of 1 to 30 μm provided with smaller pits having an average pore size in a range of 0.01 to 0.4 μm on the surfaces of the larger pits are formed. To obtain such grains, the total quantity of electricity contributing to the anodic reaction of the aluminum plate at the point of termination of the electrolytic reaction is preferably equal to or above 10 $C/dm^2$, more preferably equal to or above 50 $C/dm^2$, or even more preferably equal to or above 100 $C/dm^2$. Meanwhile, the total quantity of electricity is preferably equal to or below 2000 $C/dm^2$, or more preferably equal to or below 600 $C/dm^2$.

Current density in this case is preferably in a range of 20 to 100 $A/dm^2$ in terms of a peak current value.

When the aluminum plate is subjected to the electrolysis in hydrochloric acid while applying such a large quantity of electricity, it is possible to form large undulation and fine irregularities at the same time. It is possible to improve stain resistance by homogenizing the large undulation by the second alkaline etching to be described later.

The first electrolytic treatment using the aqueous solution containing nitric acid or hydrochloric acid can be performed in accordance with electrochemical graining methods (electrolytic graining methods) as disclosed in JP 48-28123 B and GB 896563 B, for example. Although these electrolytic graining methods use an alternating current having a sinusoidal waveform, it is also possible to use a special waveform as disclosed in JP 52-58602 A. It is also possible to use a waveform as disclosed in JP 3-79799 A. Meanwhile, it is also possible to apply methods disclosed in JP 55-158298 A, JP 56-28898 A, JP 52-58602 A, JP 52-152302 A, JP 54-85802 A, JP 60-190392 A, JP 58-120531 A, JP 63-176187 A, JP 1-5889 A, JP 1-280590 A, JP 1-118489 A, JP 1-148592 A, JP 1-178496 A, JP 1-188315 A, JP 1-154797 A, JP 2-235794 A, JP 3-260100 A, JP 3-253600 A, JP 4-72079 A, JP 4-72098 A, JP 3-267400 A, and JP 1-141094 A. In addition to the above, it is also possible to perform electrolysis by use of an alternating current having a special frequency which is disclosed as a method of manufacturing an electrolytic capacitor. Such a manufacturing method is disclosed in U.S. Pat. No. 4,276,129 and U.S. Pat. No. 4,676,879.

Although various techniques have been disclosed concerning electrolytic tanks and power sources, it is possible to apply methods disclosed in U.S. Pat. No. 4,203,637, JP 56-123400 A, JP 57-59770 A, JP 53-12738 A, JP 53-32821 A, JP 53-32822 A, JP 53-32823 A, JP 55-122896 A, JP 55-132884 A, JP 62-127500 A, JP 1-52100 A, JP 1-52098 A, JP 60-67700 A, JP 1-230800 A, and JP 3-257199 A.

In addition, it is also possible to apply methods disclosed in JP 52-58602 A, JP 52-152302 A, JP 53-12739 A, JP 53-32833 A, JP 53-32824 A, JP 53-32825 A, JP 54-85802 A, JP 48-28123 B, JP 51-7081 B, JP 52-133838 A, JP 52-133840 A, JP 52-133844 A, JP 52-133845 A, JP 53-149135 A, and JP 54-146234 A.

When the aluminum plates are continuously subjected to the electrolytic surface roughening treatment, the aluminum ion concentration in the solution is increased and the shapes of irregularities on the aluminum plate formed by the first electrolytic treatment thereby vary. Accordingly, it is preferable to manage compositions of a nitric acid electrolytic solution or a hydrochloric acid electrolytic solution as described below.

Specifically, either a matrix of conductivity, specific gravity and temperature, or a matrix of conductivity, propagation velocity of ultrasonic waves and temperature is formed in advance, each of the matrices corresponding to a matrix of a nitric or hydrochloric acid concentration and the aluminum ion concentration. Then, the compositions of the solution are measured in terms of the conductivity, the specific gravity and the temperature or in terms of the conductivity, the propagation velocity of ultrasonic waves and the temperature, and nitric or hydrochloric acid and water are added thereto so as to achieve target control values for the compositions of the solution. Thereafter, the electrolytic solution, which is increased in volume by adding nitric or hydrochloric acid and water, is allowed to overflow from a circulation tank so as to maintain the constant volume. As for nitric acid for such addition, it is possible to use one for industrial use which contains 30 to 70 wt % therein. As for hydrochloric acid for such addition, it is possible to use one for industrial purposes which contains 30 to 40 wt % therein.

A conductivity detector and a gravimeter used therein are preferably temperature compensated, respectively. Here, it is preferable to use a gravimeter of a differential pressure type.

In order to achieve higher accuracy, it is preferable that a sample collected from the electrolytic solution for measurement of the compositions of the solution be used for such measurement after controlling the solution to certain temperature (such as 40±0.5° C.) with a heat exchanger apart from one for the electrolytic solution.

Figure 4:
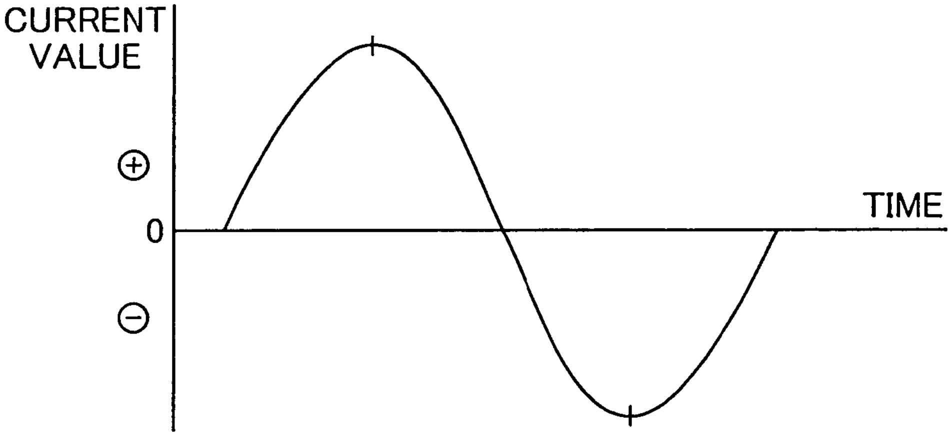
FIG. 4 is a graph showing an example of a sinusoidal waveform chart used in the electrochemical surface roughening treatment in the method of manufacturing a support for a lithographic printing plate of the present invention.

The electrolytic current waveform used in the electrochemical surface roughening treatment is not particularly limited, and a sinusoidal wave, a rectangular wave, a trapezoidal wave, a triangular wave, and the like are applicable. However, it is preferable to use any of the sinusoidal wave, the rectangular wave, and the trapezoidal wave. Among those waves, the trapezoidal wave is particularly preferred. In the case of the first electrolysis in hydrochloric acid, the sinusoidal wave is particularly preferred because it is easier to generate uniform pits having an average diameter equal to or above 1 μm. The sinusoidal wave is the one shown in FIG. 4.

The trapezoidal wave is the one shown in FIG. 1. In terms of this trapezoidal wave, time (TP) consumed by a current to reach from zero to a peak is preferably in a range of 0.5 to 3 msec. If the time TP exceeds 3 msec, an aluminum plate becomes susceptible to minor components in the electrolytic solution typified by ammonium ions which are spontaneously increased by the electrolytic treatment particularly when using the aqueous solution containing nitric acid. Accordingly, it is difficult to achieve uniform graining. As a result, stain resistance tends to be reduced when the aluminum plate is formed into a lithographic printing plate.

It is possible to use an alternating current having a duty ratio in a range of 1:2 to 2:1. However, as disclosed in JP 5-195300 A, it is preferable to apply an alternating current having a duty ratio of 1:1 in an indirect feeding mode where a conductor roll is not used for aluminum.

It is possible to use an alternating current having a frequency in a range of 0.1 to 120 Hz. However, in light of facilities, it is preferable to use an alternating current having a frequency in a range of 50 to 70 Hz. When the frequency is below 50 Hz, a carbon electrode which is a main electrode tends to be dissolved easily. On the contrary, when the frequency is above 70 Hz, the current condition is susceptible to inductance components on a power circuit and power costs are thereby increased.

Figure 2:
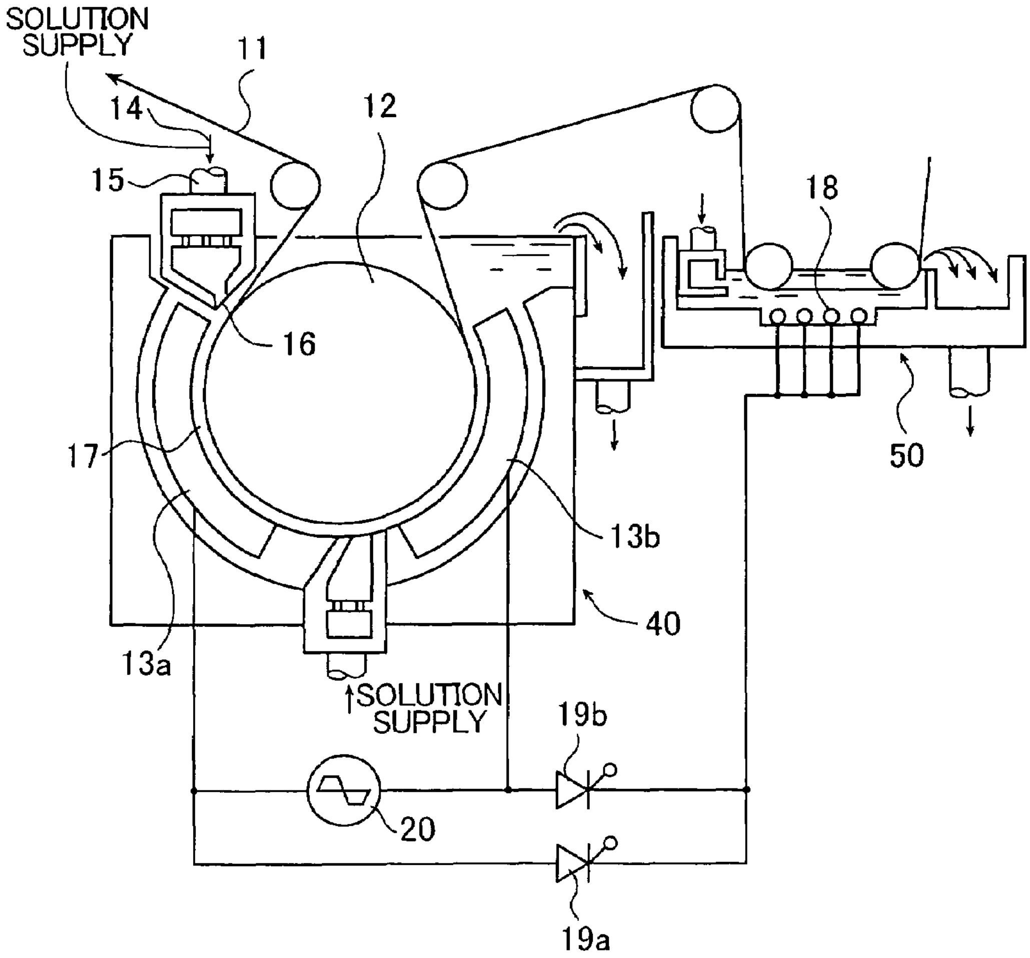
FIG. 2 is a side view showing an example of radial type cell for an electrochemical surface roughening treatment using an alternating current in the method of manufacturing a support for a lithographic printing plate of the present invention.

FIG. 2 is a side view showing an example of radial type cell for the electrochemical surface roughening treatment using the alternating current in the method of manufacturing a support for a lithographic printing plate of the present invention.

One or more alternating current power sources can be connected to an electrolytic tank. In order to perform uniform graining by controlling the current ratio between an anode and a cathode of an alternating current applied to an aluminum plate opposed to main electrodes and in order to dissolve carbon in the main electrodes, it is preferable to dispose auxiliary anodes as shown in FIG. 2 and to shunt a part of the alternating current. In FIG. 2, reference numeral 11 denotes an aluminum plate, reference numeral 12 denotes a radial drum roller, reference numerals 13*a* and 13*b* denote main electrodes, reference numeral 14 denotes an electrolytic solution, reference numeral 15 denotes an electrolytic solution inlet, reference numeral 16 denotes a slit, reference numeral 17 denotes an electrolytic solution passage, reference numeral 18 denotes auxiliary anodes, reference numerals 19*a* and 19*b* denote thyristors, reference numeral 20 denotes an alternating power source, reference numeral 40 denotes a main electrolytic tank, and reference numeral 50 denotes an auxiliary anode tank. By shunting a part of a current as a direct current into the auxiliary anodes provided apart from the two main electrodes in a different tank through a rectifier or a switching element, it is possible to control the ratio between a current value contributing to an anodic reaction acting on the aluminum plate opposed to the main electrodes and a current value contributing to a cathodic reaction. The ratio of the quantity of electricity contributing to the anodic reaction and the cathodic reaction (the quantity of electricity at the cathodic reaction/the quantity of electricity at the anodic reaction) on the aluminum plate opposed to the main electrodes is preferably in a range of 0.3 to 0.95.

Any types of publicly known electrolytic tanks applied to surface treatments, such as a vertical type, a flat type, or a radial type, can be used as the electrolytic tank. However, a radial type electrolytic tank as disclosed in JP 5-195300 A is particularly preferred. The electrolytic solution passing through the electrolytic tank may flow in a parallel direction or in a counter direction relative to a traveling direction of an aluminum web.

Meanwhile, in an electrochemical surface roughening treatment applying a direct current, it is possible to use an electrolytic solution which is used in an electrochemical surface roughening treatment applying a normal direct current. To be more precise, it is possible to use an electrolytic solution which is similar to the electrolytic solution used in the above-described electrochemical surface roughening treatment applying the alternating current.

The direct current power source waveform used in the electrochemical surface roughening treatment is not particularly limited as long as the current does not change polarity, and a comb-shaped wave, a continuous direct current, a wave obtained by subjecting a commercial alternating current to full-wave rectification with a thyristor, and the like are applicable. However, it is preferable to use a smoothed continuous direct current.

Although it is possible to perform the electrochemical surface roughening treatment applying the direct current in accordance with any of the batch method, the semicontinuous method, and the continuous method. However, it is preferable to adopt the continuous method.

An apparatus to be used in the electrochemical surface roughening treatment applying the direct current is not particularly limited as long as the apparatus is configured to apply a direct current voltage between anodes and cathodes which are arranged alternately and to allow an aluminum plate to pass through the anodes and the cathodes while maintaining the clearance.

The electrodes are not particularly limited. It is possible to use publicly known electrodes which are conventionally used in electrochemical surface roughening treatments.

As for the anode, it is preferable to use: an anode formed by plating or cladding platinum-group metal on valve metal such as titanium, tantalum or niobium; an anode formed by coating or sintering a platinum-group metal oxide on the valve metal; aluminum; stainless steel, for example. Among these anodes, an anode formed by cladding platinum on the valve metal is preferred. A method such as water cooling by passing water inside the electrode can further extend the anode life.

As for the cathode, it is possible to select metal or the like from the Pourbaix diagram, which is not dissolved when electrode potential is set negative. Among such substances, carbon is preferred.

Arrangement of the electrodes can be selected appropriately in accordance with the wave structure. Moreover, it is possible to adjust the wave structure by changing lengths of the anode and cathode in the traveling direction of the aluminum plate, changing passage time of the aluminum plate, or by changing a flow rate, temperature, compositions or current density of the electrolytic solution. Meanwhile, when using an apparatus provided with a tank for the anode and a tank for a cathode separately, it is also possible to change electrolytic conditions of the respective treatment tanks.

After completing the first electrolytic treatment, it is preferable to drain the solution off with a nip roller, then to perform a water washing treatment for 1 to 10 seconds, and then to drain the water off with the nip roller.

The water washing treatment is preferably carried out by use of spray tubes. As the spray tube for use in the water washing treatment, it is possible to use a spray tube provided with a plurality of spray tips arranged along the width direction of the aluminum plate, which are configured to fan out injection water. The distance between the adjacent spray tips is preferably in a range of 20 to 100 mm, and a fluid volume of each spray tip is preferably in a range of 1 to 20 L/min. It is preferable to use a plurality of such spray tubes.

<Second alkaline etching treatment>

The second alkaline etching treatment, which is carried out between the first electrolytic treatment and the second electrolytic treatment, aims at dissolving smuts generated in the first electrolytic treatment and dissolving edge portions of the pits formed by the first electrolytic treatment. By applying the second alkaline etching treatment, the edge portions of the large pits formed by the first electrolytic treatment are dissolved and the surface is thereby smoothed. As a consequence, ink will not be easily caught by the edge portions. Accordingly, it is possible to obtain a presensitized plate having excellent stain resistance.

The second alkaline etching treatment is basically similar to the first alkaline etching treatment. Accordingly, only the difference will be described below.

In the second alkaline etching treatment, the etching amount is preferably equal to or above 0.05 $g/m^2$, or more preferably equal to or above 0.1 $g/m^2$. Meanwhile, the etching amount is preferably equal to or below 4 $g/m^2$, or more preferably equal to or below 3.5 $g/m^2$. When the etching amount is equal to or above 0.05 $g/m^2$, the edge portions of the pits generated in the first electrolytic treatment are smoothed in a non-image area of the lithographic printing plate and ink is hardly caught by the edge portions. Accordingly, it is possible to achieve excellent stain resistance. In the meantime, when the etching amount is equal to or below 4 $g/m^2$, the irregularities generated in the first electrolytic treatment are increased in size. Accordingly, it is possible to achieve excellent press life.

In the second alkaline etching treatment, the concentration of the alkaline solution is preferably equal to or above 30 g/L, or more preferably equal to or above 300 g/L. Meanwhile, the concentration of the alkaline solution is preferably equal to or below 500 g/L, or more preferably equal to or below 450 g/L.

Moreover, it is preferable that the alkaline solution contains aluminum ions. The aluminum ion concentration is preferably equal to or above 1 g/L, or more preferably equal to or above 50 g/L. Meanwhile, the aluminum ion concentration is preferably equal to or below 200 g/L, or more preferably equal to or below 150 g/L. Such an alkaline solution can be prepared by use of water, a 48-wt % caustic soda aqueous solution, and sodium aluminate, for example.

<Second desmutting treatment>

After performing the second alkaline etching treatment, it is preferable to perform acid washing (a second desmutting treatment) in order to remove stains (smuts) remaining on the surface. The second desmutting treatment can be carried out in the same method as the first desmutting treatment.

It is preferable to use either nitric acid or sulfuric acid in the second desmutting treatment.

In the second desmutting treatment, it is preferable to use an acidic solution containing an acid in a range of 1 to 400 g/L and aluminum ions in a range of 0.1 to 8 g/L.

To be more precise, when using sulfuric acid, it is possible to use a solution prepared by dissolving aluminum sulfate in a sulfuric acid aqueous solution having a sulfuric acid concentration in a range of 100 to 350 g/L, so as to adjust the aluminum ion concentration to a range of 0.1 to 5 g/L. Alternatively, it is possible to use overflow waste of an electrolytic solution used in the anodic oxidation treatment to be described later.

In the second desmutting treatment, the treating time is preferably equal to or above 1 second, or more preferably equal to or above 4 seconds. Meanwhile, the treating time is preferably equal to or below 60 seconds, or more preferably equal to or below 20 seconds.

In the second desmutting treatment, temperature of the acidic solution is preferably equal to or above 20° C., or more preferably equal to or above 30° C. Meanwhile, the temperature is preferably equal to or below 70° C., or more preferably equal to or below 60° C.

<Second electrolytic treatment (second electrolysis in hydrochloric acid)>

The second electrolytic treatment is an electrochemical surface roughening treatment to be performed in an aqueous solution containing hydrochloric acid by use of an alternating or direct current. It is acceptable to carry out only the above-described first electrolytic treatment in the present invention. However, by combining this second electrolytic treatment, it is possible to form more complicated irregular structures on the surface of the aluminum plate and thereby to achieve excellent press life.

The second electrolysis in hydrochloric acid to be performed after the first electrolytic treatment is basically similar to those described in terms of the first electrolysis in hydrochloric acid.

The total quantity of electricity received by the aluminum plate in the anodic reaction in the course of electrochemical surface roughening in the aqueous solution containing hydrochloric acid used in the second electrolysis in hydrochloric acid can be selected in a range of 10 to 200 $C/dm^2$ at a point of completion of the electrochemical surface roughening treatment. In order not to significantly damage the roughened surface formed in the first electrolytic treatment, the total quantity of electricity is preferably in a range of 10 to 100 $C/dm^2$, or more preferably in a range of 50 to 80 $C/dm^2$.

<First alkaline etching treatment—first electrolytic (surface roughening) treatment in nitric acid—second alkaline etching treatment—second electrolytic (surface roughening) treatment in hydrochloric acid>

When performing the above-described combination of treatments, it is preferable to carry out the first electrochemical surface roughening treatment in the electrolytic solution containing nitric acid while applying the total quantity of electricity in the anodic reaction in a range of 65 to 500 $dm^2$, to chemically dissolve Al in an amount of not less than 0.1 $g/m^2$, to carry out the second electrochemical surface roughening treatment in the electrolytic solution containing hydrochloric acid while applying the total quantity of electricity in the anodic reaction in a range of 25 to 100 $dm^2$, and then to chemically dissolve Al in an amount of not less than 0.03 $g/m^2$. By subjecting the aluminum alloy blank of the present invention to the surface roughening treatments according to the above-described combination, it is possible to obtain the support for a lithographic printing plate which has excellent stain resistance and press life.

<Third alkaline etching treatment>

The third alkaline etching treatment, which is performed after the second electrolytic treatment, aims at dissolving the smuts generated in second electrolytic treatment and at dissolving edge portions of the pits which are formed in the second electrolytic treatment. The third alkaline etching treatment is basically similar to the first alkaline etching treatment. Accordingly, only the difference will be described below.

In the third alkaline etching treatment, the etching amount is preferably equal to or above 0.05 $g/m^2$, or more preferably equal to or above 0.1 $g/m^2$. Meanwhile, the etching amount is preferably equal to or below 0.3 $g/m^2$, or more preferably equal to or below 0.25 $g/m^2$. When the etching amount is equal to or above 0.05 $g/m^2$, the edge portions of the pits generated in the second electrolytic treatment in hydrochloric acid are smoothed in a non-image area of the lithographic printing plate and ink is hardly caught by the edge portions. Accordingly, it is possible to achieve excellent stain resistance. In the meantime, when the etching amount is equal to or below 0.3 $g/m^2$, the irregularities generated in the first electrolytic treatment in hydrochloric acid and the second electrolytic treatment in hydrochloric acid are increased in size. Accordingly, it is possible to achieve excellent press life.

In the third alkaline etching treatment, the concentration of the alkaline solution is preferably equal to or above 30 g/L. Meanwhile, in order not to excessively reduce the sizes of the irregularities generated in the precedent alternating current electrolyses in hydrochloric acid, the concentration of the alkaline solution is preferably equal to or below 100 g/L, or more preferably equal to or below 70 g/L.

Moreover, it is preferable that the alkaline solution contain aluminum ions. The aluminum ion concentration is preferably equal to or above 1 g/L, or more preferably equal to or above 3 g/L. Meanwhile, the aluminum ion concentration is preferably equal to or below 50 g/L, or more preferably equal to or below 8 g/L. Such an alkaline solution can be prepared by use of water, a 48-wt % caustic soda aqueous solution, and sodium aluminate, for example.

In the third alkaline etching treatment, the temperature of the alkaline solution is preferably equal to or above 25° C., or more preferably equal to or above 30° C. Meanwhile, the temperature is preferably equal to or below 60° C., or more preferably equal to or below 50° C.

In the third alkaline etching treatment, the treating time is preferably equal to or above 1 second or more preferably equal to or above 2 seconds. Meanwhile, the treating time is preferably equal to or below 30 seconds, or more preferably equal to or below 10 seconds.

<Third desmutting treatment>

After performing the third alkaline etching treatment, it is preferable to perform acid washing (a third desmutting treatment) in order to remove stains (smuts) remaining on the surface. The third desmutting treatment is basically similar to the first desmutting treatment. Accordingly, only the difference will be described below.

In the third desmutting treatment, it is preferable to use the acidic solution containing an acid in a range of 5 to 400 g/L and aluminum ions in a range of 0.5 to 8 g/L. To be more precise, when using sulfuric acid, it is preferable to use the solution prepared by dissolving aluminum sulfate in a sulfuric acid aqueous solution having the sulfuric acid concentration in a range of 100 to 350 g/L, so as to adjust the aluminum ion concentration to a range of 1 to 5 g/L.

In the third desmutting treatment, the treating time is preferably equal to or above 1 second, or more preferably equal to or above 4 seconds. Meanwhile, the treating time is preferably equal to or below 60 seconds, or more preferably equal to or below 15 seconds.

In the third desmutting treatment, when the same type of solution as the electrolytic solution to be used in the subsequent anodic oxidation treatment is used as a desmutting solution, it is possible to omit draining and a water washing treatment by use of a nip roller after the desmutting treatment.

<Anodic oxidation treatment>

The aluminum plate after the above-described treatments is further subjected to the anodic oxidation treatment. The anodic oxidation treatment can be carried out in accordance with a method conventionally practiced in this field. In this case, it is possible to form an anodized film by applying electricity to the aluminum plate as the anode in a solution having the sulfuric acid concentration in a range of 50 to 300 g/L and the aluminum ion concentration equal to or below 5 wt %. As for the solution used in the anodic oxidation treatment, it is possible to use any one of or a combination of sulfuric acid, phosphoric acid, chromic acid, oxalic acid, sulfamic acid, benzensulfonic acid, amidosulfonic acid, and the like.

At this time, at least any components normally contained in the aluminum plate, the electrodes, tap water, underground water, and the like may be contained in the electrolytic solution. Further, second and third components may be added thereto. The second and third components cited herein may be: metal ions of Na, K, Mg, Li, Ca, Ti, Al, V, Cr, Mn, Fe, Co, Ni, Cu, Zn, and the like; positive ions such as ammonium ions; and negative ions such as nitrate ions, carbonate ions, chloride ions, phosphate ions, fluoride ions, sulfite ions, titanate ions, silicate ions, or borate ions, for example. Such components may be contained in a concentration of about 0 to 10000 ppm.

Conditions of the anodic oxidation treatment vary depending on the electrolytic solution to be used and therefore cannot be determined universally. However, in general, it is preferable to use the concentration of the electrolytic solution in a range of 1 to 80 wt %, the temperature of the solution in a range of 5° C. to 70° C., the current density in a range of 0.5 to 60 $A/dm^2$, the voltage in a range of 1 to 100 V, and the time for electrolysis in a range of 15 seconds to 50 minutes. These conditions are appropriately adjusted to form a desired amount of the anodized film.

Meanwhile, it is also possible to apply methods disclosed in JP 54-81133 A, JP 57-47894 A, JP 57-51289 A, JP 57-51290 A, JP 57-54300A, JP 57-136596 A, JP 58-107498 A, JP 60-200256 A, JP 62-136596 A, JP 63-176494 A, JP 4-176897 A, JP 4-280997 A, JP 6-207299 A, JP 5-24377 A, JP 5-32083 A, JP 5-125597 A, and JP 5-195291 A.

Among these methods, as disclosed in JP 54-12853 A and in JP 48-45303 A, it is preferable to use a sulfuric acid solution as the electrolytic solution. The sulfuric acid concentration in the electrolytic solution is preferably in a range of 10 to 300 g/L (1 to 30 wt %), or more preferably in a range of 50 to 200 g/L (5 to 20 wt %). Meanwhile, the aluminum ion concentration is preferably in a range of 1 to 25 g/L (0.1 to 2.5 wt %), or more preferably in a range of 2 to 10 g/L (0.2 to 1 wt %). Such an electrolytic solution can be prepared by adding aluminum sulfate or the like to dilute sulfuric acid having a concentration in a range of 50 to 200 g/L, for example.

The compositions of the electrolytic solution are preferably managed by conductivity, specific gravity and temperature, or, by conductivity, propagation velocity of ultrasonic waves and temperature corresponding to a matrix of the sulfuric acid concentration and the aluminum ion concentration, by using a method similar to the above-described electrolysis in nitric acid.

The temperature of the electrolytic solution is preferably in a range of 25° C. to 55° C., or more preferably in a range of 30° C. to 50° C.

When performing the anodic oxidation treatment in the electrolytic solution containing sulfuric acid, a direct or alternating current may be applied between the aluminum plate and the counter electrodes.

When a direct current is applied to the aluminum plate, the current density is preferably in a range of 1 to 60 $A/dm^2$, or more preferably in a range of 5 to 40 $A/dm^2$.

When performing the anodic oxidation treatment continuously, it is preferable to apply a current at low current density in a range of 5 to 10 $A/dm^2$ in the beginning of the anodic oxidation treatment and then to raise the current density up to a range of 30 to 50 $A/dm^2$ or even higher along with the progress of the anodic oxidation treatment, so as not to cause so-called "burning" (by which the film becomes thicker than surrounding portions) owing to the current which is focused on a part of the aluminum plate.

To be more precise, it is preferable to distribute currents from a direct current power source such that a current from the direct current power source on a downstream side is equal to or higher than a current from the direct current power source on an upstream side. By adopting such current distribution, generation of a so-called burn is suppressed. As a consequence, it is possible to perform the anodic oxidation treatment at a high rate.

When performing the anodic oxidation treatment continuously, it is preferable to carry out a liquid power supply method configured to supply electricity to the aluminum plate through the electrolytic solution.

A porous film provided with numerous holes called pores (micropores) is obtained by performing the anodic oxidation treatment under the conditions described above. Normally, the average pore diameter thereof is in a range of about 5 to 50 nm, and the average pore density thereof is in a range of about 300 to 800 pcs/$\mu m^2$.

The quantity of the anodized film is preferably in a range of 1 to 5 $g/m^2$. The plate easily causes flaws when the quantity is below 1 $g/m^2$. On the contrary, when the quantity exceeds 5 $g/m^2$, a large amount of electricity is required for manufacturing and it is therefore economically disadvantageous. The quantity of the anodized film is more preferably in a range of 1.5 to 4 $g/m^2$. Moreover, it is preferable to perform the anodic oxidation treatment such that a difference in quantity of the anodized film between the central portion and the vicinity of edge portions of the aluminum plate is equal to or below 1 $g/m^2$.

As for an electrolytic apparatus for use in the anodic oxidation treatment, it is possible to use techniques disclosed in JP 48-26638 A, JP 47-18739 A, JP 58-24517 B, and JP 2001-11698 A.

Figure 3:
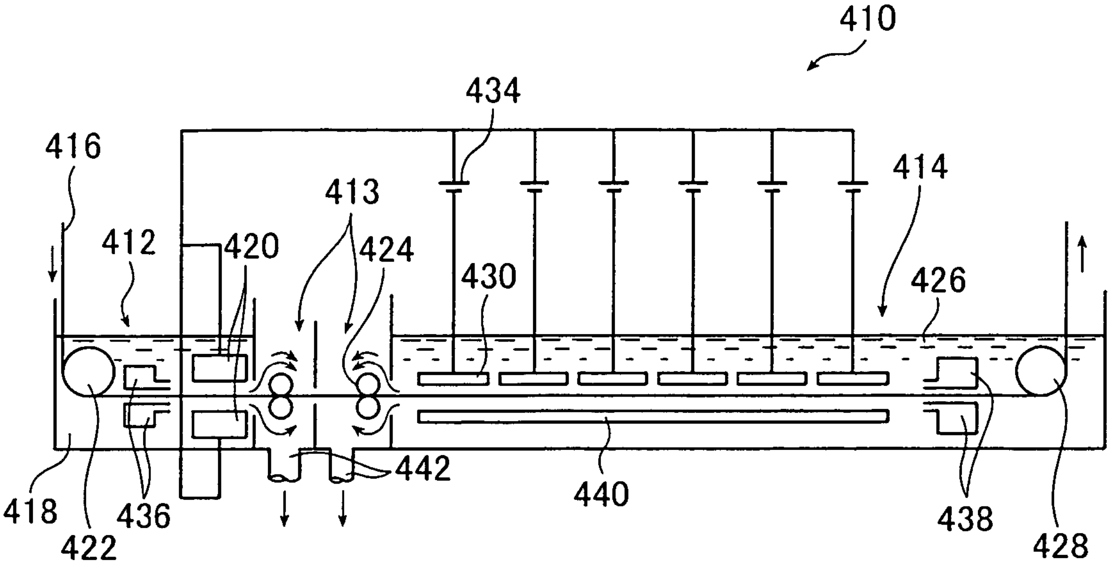
FIG. 3 is a schematic diagram of an anodic oxidation apparatus used in an anodic oxidation treatment in the method of manufacturing a support for a lithographic printing plate of the present invention.

Among these techniques, an apparatus shown in FIG. 3 is preferably used. FIG. 3 is a schematic diagram showing an example of an apparatus configured to perform an anodic oxidation treatment on a surface of an aluminum plate.

In an anodic oxidation apparatus 410 shown in FIG. 3, a power supply tank 412 is disposed on an upstream side in a traveling direction of an aluminum plate 416 and an anodic oxidation treatment tank 414 is disposed on a downstream side in order to supply electricity to the aluminum plate 416 through an electrolytic solution. The aluminum plate 416 is conveyed as indicated by arrows in FIG. 3 by way of path rollers 422 and 428. Anodes 420 which are connected to positive terminals of direct current power sources 434 are disposed in the power supply tank 412 to which the aluminum plate 416 is firstly introduced. Here, the aluminum plate 416 constitutes a cathode. Accordingly, a cathodic reaction takes place on the aluminum plate 416.

Cathodes 430 which are connected to negative terminals of the direct current power sources 434 are disposed in the anodic oxidation treatment tank 414 to which the aluminum plate 416 is subsequently introduced. Here, the aluminum plate 416 constitutes an anode. Accordingly, an anodic reaction takes place on the aluminum plate 416, and the anodized film is formed on the surface of the aluminum plate 416.

Clearance between the aluminum plate 416 and the cathodes 430 is preferably in a range of 50 to 200 mm. Aluminum is used for the cathodes 430. In order to allow hydrogen gas generated in the anodic reaction to escape easily from the system, it is preferable to form the anodes 430 not as electrodes having large areas but as electrodes which are split into multiple pieces along with the traveling direction of the aluminum plate 416.

As shown in FIG. 3, between the power supply tank 412 and the anodic oxidation treatment tank 414, it is preferable to provide a tank called an intermediate tank 413 which drains off an electrolytic solution. By providing the intermediate tank 413, it is possible to suppress bypassing of the current from the anodes 420 to the cathodes 430 instead of passing through the aluminum plate 416. It is preferable to provide nip rollers 424 in the intermediate tank 413 for draining so as to minimize the bypass current. The electrolytic solution removed by draining is discharged from a solution outlet 442 to the outside of the anodic oxidation apparatus 410.

To reduce voltage losses, an electrolytic solution 418 to be stored in the power supply tank 412 has a higher temperature and/or a higher concentration than an electrolytic solution 426 to be stored in the anodic oxidation treatment tank 414. Moreover, compositions, temperatures, and the like of the electrolytic solutions 418 and 426 are determined based on efficiency of formation of the anodized film, shapes of the micropores on the anodized film, hardness of the anodized film, voltages, costs of the electrolytic solutions, and the like.

The electrolytic solutions are supplied to the power supply tank 412 and the anodic oxidation treatment tank 414 by squirting the electrolytic solutions from solution supply nozzles 436 and 438. In order to distribute the electrolytic solution constantly and to prevent local current constriction on the aluminum plate 416 in the anodic oxidation treatment tank 414, the solution supply nozzles 436 and 438 are provided with slits and are thereby configured to stabilize the squirted solutions in the width direction.

In the anodic oxidation treatment tank 414, a shielding plate 440 is provided on an opposite side of the cathodes 430 across the aluminum plate 416. The shielding plate 440 suppresses the current to flow on an opposite side to the surface on which the anodized film is to be formed. Clearance between the aluminum plate 416 and the shielding plate 440 is preferably in a range of 5 to 30 mm. It is preferable to use a plurality of direct current power sources 434 while connecting the positive terminals together. In this way, it is possible to control the current distribution in the anodic oxidation treatment tank 414.

<Sealing treatment>

In the present invention, it is possible to carry out a sealing treatment for sealing the micropores which exist on the anodized film when appropriate. The sealing treatment can be carried out in accordance with publicly known methods such as a boiling water treatment, a hot water treatment, a steam treatment, a sodium silicate treatment, a nitrite treatment, or an ammonium acetate treatment. For example, it is possible to carry out the sealing treatment by use of apparatuses and methods disclosed in JP 56-12518 B, JP 4-4194 A, JP 5-202496 A, JP 5-179482 A, and the like.

<Hydrophilic treatment>

A hydrophilic treatment may be carried out after the anodic oxidation treatment or the sealing treatment. The hydrophilic treatment may be a potassium fluorozirconate treatment disclosed in U.S. Pat. No. 2,946,638 A, a phosphomolybdate treatment disclosed in U.S. Pat. No. 3,201,247 A, an alkyl titanate treatment disclosed in GB 1108559 B, a polyacrylic acid treatment disclosed in DE 1091433 B, a polyvinyl phosphonic acid treatment disclosed in DE 1134093 B and in GB 1230447 B, a phosphonic acid treatment disclosed in JP 44-6409 B, a phytic acid treatment disclosed in U.S. Pat. No. 3,307,951, a treatment using a lipophilic polymer compound and a bivalent metal salt disclosed in JP 58-16893 and JP 58-18291, a treatment of providing an undercoating layer of hydrophilic cellulose (such as carboxymethylcellulose) containing a water-soluble metal salt (such as zinc acetate) as disclosed in U.S. Pat. No. 3,860,426, and a treatment of undercoating a water-soluble polymer having a sulfo group disclosed in JP 59-101651 A.

It is also possible to perform an undercoating treatment using any of a phosphate disclosed in JP 62-019494 A, a water-soluble epoxy compound disclosed in JP 62-033692 A, phosphate-modified starch disclosed in JP 62-097892 A, a diamine compound disclosed in JP 63-056498 A, an inorganic or organic amino acid disclosed in JP 63-130391 A, an organic phosphonic acid containing a carboxy group or a hydroxyl group disclosed in JP 63-145092 A, a compound having an amino group and a phosphonic acid group disclosed in JP 63-165183 A, a specific carbonic acid derivative disclosed in JP 2-316290 A, a phosphate ester disclosed in JP 3-215095 A, a compound having one amino group and one phosphorous oxyacid group disclosed in JP 3-261592 A, an aliphatic or aromatic phosphonic acid such as phenylphosphonic acid disclosed in JP 5-246171 A, a compound having a S atom such as thiosalicylic acid disclosed in JP 1-307745 A, a compound having a phosphorous oxyacid group disclosed in JP 4-282637 A, and the like.

In addition, it is also possible to perform coloring by use of an acidic dye disclosed in JP 60-64352 A.

Moreover, it is preferable to perform the hydrophilic treatment in accordance with a method of dipping the aluminum plate in an aqueous solution of an alkali metal silicate such as sodium silicate or potassium silicate, a method of forming a hydrophilic undercoating layer by coating either a hydrophilic vinyl polymer or a hydrophilic compound, or the like.

The hydrophilic treatment using an aqueous solution of an alkali metal silicate such as sodium silicate or potassium silicate can be performed in accordance with methods and procedures disclosed in U.S. Pat. No. 2,714,066 and U.S. Pat. No. 3,181,461.

The alkali metal silicate may be sodium silicate, potassium silicate, and lithium silicate, for example. The aqueous solution of the alkali metal silicate may contain an appropriate amount of sodium hydroxide, potassium hydroxide, lithium hydroxide, and the like.

Meanwhile, the aqueous solution of the alkali metal silicate may contain an alkali earth metal salt or a Group 4 (Group IVA) metal salt. The alkali earth metal salt may be: a nitrate such as calcium nitrate, strontium nitrate, magnesium nitrate, barium nitrate; a sulfate; a hydrochloride; a phosphate; an acetate; an oxalate; a borate, for example. The Group 4 (Group IVA) metal salt may be titanium tetrachloride, titanium trichloride, potassium fluorotitanate, potassium titanium oxalate, titanium sulfate, titanium tetraiodide, zirconium oxychloride, zirconium dioxide, and zirconium tetrachloride, for example. These alkali earth metal salts and the Group 4 (Group IVA) metal salts are used either singly or in a combination of two or more types.

The Si amount adsorbed by the alkali metal silicate treatment can be measured by use of an x-ray fluorescence spectrometer, and such an adsorption amount is preferably in a range of about 1.0 to 15.0 mg/m$^2$.

By performing the alkali metal silicate treatment, it is possible to obtain an effect of improving dissolution resistance of the surface of the support for a lithographic printing plate to an alkaline developer, and to suppress dissolution of the aluminum component in the developer. Accordingly, it is possible to reduce generation of development scum attributable to fatigue of the developer.

Meanwhile, the hydrophilic treatment by forming the hydrophilic undercoating layer can be performed in accordance with conditions and procedures disclosed in JP 59-101651 A and JP 60-149491 A.

The hydrophilic vinyl polymer to be used in this method may be polyvinylsulfonic acid, and a copolymer compound of a vinyl polymer compound having a sulfo group such as p-styrene sulfonic acid and a normal vinyl polymer compound such as (meta)acrylate alkyl ester, for example. Meanwhile, the hydrophilic compound to be used in this method may be a compound including at least any one of the group consisting of a —$NH_2$ group, a —COOH group, and a sulfo group, for example.

<Drying>

After the support for a lithographic printing plate is obtained as described above, it is preferable to dry the surface of the support for a lithographic printing plate before providing the image recording layer. It is preferable to perform drying after completing the final process of the surface treatment, the water washing treatment, and draining with the nip roller.

Temperature for drying is preferably equal to or above 70° C., or more preferably equal to or above 80° C. Meanwhile, the temperature is preferably equal to or below 110° C., or more preferably equal to or below 100° C.

The drying time is preferably equal to or above 1 second or more preferably equal to or above 2 seconds. Meanwhile, the drying time is preferably equal to or below 20 seconds, or more preferably equal to or below 15 seconds.

<Management of compositions of solutions>

In the present invention, the compositions of the respective treatment solutions used in the above-described surface treatment are preferably managed by a method disclosed in JP 2001-121837 A. It is preferable to prepare multiple samples of the treatment solutions in various concentrations in advance, to measure the propagation velocity of ultrasonic waves regarding two levels of temperature of the respective solutions, and to produce a matrix data table. Moreover, during the treatments, it is preferable to measure the temperature of the solutions and the propagation velocity of ultrasonic waves in real time, and to control the concentrations based on the measurement results. Particularly, when the electrolytic solution having the sulfuric acid concentration equal to or above 250 g/L is used in the desmutting treatment, it is preferable to control the concentration according to the above-described method.

Here, it is preferable that the respective electrolytic solutions used in the electrolytic surface roughening treatments and in the anodic oxidation treatment have a Cu concentration equal to or below 100 ppm. When the Cu content is too high, Cu is deposited on the aluminum plate when a production line is stopped. In this case, the deposited Cu is transferred to the path rollers when the production line is restarted and may cause uneven treatments.

(Presensitized plate)

The support for a lithographic printing plate obtained by the present invention can be formed into a presensitized plate of the present invention by providing the image recording layer. A photosensitive composition is used in the image recording layer.

The photosensitive composition suitable for use in the present invention may be a thermal positive photosensitive composition containing an alkali-soluble polymer compound and a photothermal conversion material (this composition and an image recording layer using this composition will be hereinafter referred to as a "thermal positive type"), a thermal negative photosensitive composition containing a setting compound and a photothermal conversion material (hereinafter similarly referred to as a "thermal negative type"), a photopolymerization type photosensitive composition (hereinafter similarly referred to as a "photopolymer type"), a negative photosensitive composition containing diazo resin or a photocrosslinkable resin (hereinafter similarly referred to as a "conventional negative type"), a positive photosensitive composition containing a quinone diazide compound (hereinafter similarly referred to as a "conventional positive type"), and a photosensitive composition which does not require a special developing process (hereinafter similarly referred to as a "non-treatment type"), for example. Now, these suitable photosensitive compositions will be described below.

<Thermal positive type>

<Photosensitive layer>

The thermal positive type photosensitive composition contains an alkali-soluble polymer compound and a photothermal conversion material. On the image recording layer of the thermal positive type, the photothermal conversion material converts light energy as from an infrared laser into heat, and the heat efficiently cancels an interaction which is reducing alkali solubility of the alkali-soluble polymer compound.

The alkali-soluble polymer compound may be resin having an acidic group in the molecule thereof, and a mixture of two or more types of such resin, for example. Particularly, it is preferable to use resin having an acidic group such as a phenolic hydroxy group, a sulfonamide group ($—SO_2NH—R$ (R in the formula represents a hydrocarbon group)), or an active imino group ($—SO_2NHCOR$, $—SO_2NHSO_2R$, or $—CONHSO_2R$(R in the respective formulae is as defined above)), for example, in light of solubility to the alkaline developer.

Among these materials, the resin having a phenolic hydroxy group is preferred in light of excellent image formation property by exposure to the light as from an infrared laser. The suitable resin having a phenolic hydroxy group may be novolac resin such as phenol formaldehyde resin, m-cresol formaldehyde resin, p-cresol formaldehyde resin, or m-/p-mixed cresol formaldehyde resin, phenol/cresol-mixed (any of m-, p-, and m-/p-mixed types are acceptable) formaldehyde resin (phenol-cresol-formaldehyde cocondensed resin).

In addition, a polymer compound disclosed in JP 2001-305722 A (paragraph numbers from [0023] to [0042], in particular), a polymer compound disclosed in JP 2001-215693 A which has a repeating unit expressed by a general formula (1), and a polymer compound disclosed in JP 2002-311570 A (paragraph number [0107], in particular) are also suitable.

In light of recording sensitivity, the suitable examples of the photothermal conversion material include pigments and dyes having a light absorption range in the infrared wavelength range of 700 to 1200 nm. The preferable dyes may include a azo dye, a metal complex salt azo dye, a pyrazolone azo dye, a naphthoquinone dye, an anthraquinone dye, a phthalocyanine dye, a carbonium dye, a quinoneimine dye, a methine dye, a cyanine dye, a squalirium dye, a pyrilium salt, and a metal thiolate complex (such as nickel thiolate complex). Among these materials, a cyanine dye is particularly preferred. More specifically, a cyanine dye expressed by a general formula (I) in JP 2001-305722 A is preferred.

The thermal positive type photosensitive composition may contain a dissolution blocker. The preferable dissolution blockers may include those disclosed in paragraph numbers from [0053] to [0055] in JP 2001-305722 A, for example.

Moreover, it is preferable that the thermal positive type photosensitive composition contain additives including a sensitivity adjuster, a printing agent for obtaining a visible image immediately after heating by light exposure, a compound such as a dye as an image coloring agent, and a surfactant for improving a coating property and treatment stability. As for these additives, compounds disclosed in paragraph numbers from [0056] to [0060] in JP 2001-305722 A are preferred.

The photosensitive compositions described in detail in JP 2001-305722 A are preferably used for other purposes as well.

Moreover, the image recording layer of the thermal positive type is not limited to a single layer type, and a two-layer type structure is also applicable.

A preferable image recording layer of a two-layer structure (a duplex type image recording layer) is a type in which a lower layer having excellent press life and solvent resistance (hereinafter referred to a "layer A") is provided on a side close to the support and a layer having an excellent positive image formation property (hereinafter referred to as a "layer B") is provided thereon. This type has high sensitivity and can therefore achieve wide development latitude. The layer B generally includes a photothermal conversion material. The aforementioned dyes are suitable for the photothermal conversion material.

As for the resin to be used in the layer A, a polymer containing a monomer having a sulfonamide group, an active imino group, a phenol hydroxy group or the like as a copolymer component is preferred in terms of excellent press life and solvent resistance. As for the resin to be used in the layer B, a resin soluble to an alkaline aqueous solution and having a phenolic hydroxy group is preferred.

In addition to the above-described resin, the compositions used in the layer A and the layer B may contain other various additives when appropriate. To be more precise, various additives disclosed in paragraph numbers from [0062] to [0085] in JP 2000-3233769 A are preferably used. Moreover, the above-described additives disclosed in the paragraph numbers from [0053] to [0060] in JP 2001-305722 A are preferably used as well.

The respective components constituting the layer A and the layer B, and the contents thereof are preferably controlled as disclosed in JP 11-218914 A.

<Intermediate layer>

It is preferable to provide an intermediate layer between the image recording layer of the thermal positive type and the support. As the components to be contained in the intermediate layer, it is preferable to use various organic compounds disclosed in paragraph number [0068] in JP 2001-305722 A.

<Others>

As a method of manufacturing the image recording layer of the thermal positive type and a plate making method, it is possible to use methods described in detail in JP 2001-305722 A.

<Thermal negative type>

The thermal negative type photosensitive composition contains a setting compound and a photothermal conversion material. The image recording layer of the thermal negative type is a negative photosensitive layer in which a portion irradiated with light such as infrared laser light is cured to form an image area.

<Polymerization layer>

One preferable image recording layer of the thermal negative type is a polymerization type image recording layer (a polymerization layer). The polymerization layer contains the photothermal conversion material, a radical generator, a radical polymerizable compound which is a setting compound, and a binder polymer. In the polymerization layer, the photothermal conversion material converts the absorbed infrared rays into heat, then the heat decomposes the radical generator to generate a radical, and the radical polymerizable compound is put into a chain reaction by the generated radical and is thereby cured.

The photothermal conversion material may be the photothermal conversion material to be used in the above-described thermal positive type, for example. Particularly preferable examples of the cyanine dyes are disclosed in paragraph numbers from [0017] to [0019] in JP 2001-133969 A.

Onium salt is preferred as the radical generator. Particularly, onium salt disclosed in paragraph numbers from [0030] to [0033] in JP 2001-133969 A are preferred.

The radical polymerizable compound may be a compound having at least one or preferably two or more terminal ethylenically unsaturated bonds.

Linear organic polymers are preferred as the binder polymer. Specifically, linear organic polymers having solubility or a swelling property with respect to water or a weakly alkaline water are preferred. Among such polymers, (meta)acrylic resin with a side chain having either an unsaturated group typified by an allyl group and an acryloyl group or a benzyl group, and, a carboxy group, is preferred in light of an excellent balance between film strength, sensitivity, and a development property.

Concerning the radical polymerizable compound and the binder polymer, it is possible to use materials described in detail in paragraph numbers from [0036] to [0060] in JP 2001-133969 A.

It is preferable that the thermal negative type photosensitive composition contain additives (such as a surfactant for improving a coating property) disclosed in paragraph numbers from [0061] to [0068] in JP 2001-133969 A.

As a method of manufacturing the polymerization layer and a plate making method, it is possible to use methods described in detail in JP 2001-133969 A.

<Acid crosslink layer>

Moreover, an acid crosslink type image recording layer (an acid cross link layer) is also preferred as another image recording layer of the thermal negative type. The acid crosslink layer contains a photothermal conversion material, a thermal acid generator, an acid-crosslinkable compound (a crosslinking agent) which is a setting compound, and an alkali-soluble polymer compound which can react with the crosslinking agent in the presence of acid. In the acid crosslink layer, the photothermal conversion material converts the absorbed infrared rays into heat, then the heat decomposes the thermal acid generator to generate an acid, and the generated acid causes a reaction between the crosslinking agent and the alkali-soluble polymer compound for curing.

Those materials used in the polymerization layer may be used for the photothermal conversion material.

The thermal acid generator may be a thermal decomposition compound such as a photoinitiator for photopolymerization, a color-turning agent for pigments, or an acid generator used for micro resist.

The crosslinking agent may be: an aromatic compound substituted by a hydroxymethyl group or an alkoxymethyl group; a compound having an N-hydroxymethyl group, an N-alkoxymethyl group or an N-acyloxymethyl group; and an epoxy compound, for example.

The alkali-soluble polymer compound may be novolac resin or a polymer with a side chain having a hydroxyaryl group, for example.

<Photopolymer type>

The photopolymerization type photosensitive composition includes an addition polymerizable compound, a photopolymerization initiator, and a high molecular weight binder.

The preferable addition polymerizable compound may be an ethylenically unsaturated bond-containing compound which is addition polymerizable. The ethylenically unsaturated bond-containing compound is a compound having a terminal ethylenically unsaturated bond. To be more precise, the ethylenically unsaturated bond-containing compound has various chemical aspects such as a monomer, a prepolymer, and a mixture thereof, for example. The monomer may be an ester of an unsaturated carboxylic acid (such as acrylic acid, methacrylic acid, itaconic acid or maleic acid) and an aliphatic polyvalent amine compound, and an amide of an unsaturated carboxylic acid and an aliphatic polyvalent amine compound.

Moreover, a urethane addition polymerizable compound is also preferred as the addition polymerizable compound.

The photopolymerization initiator can be selected from among various photopolymerization initiators or a combined system of two or more photopolymerization initiators (a photopolymerization initiating system) as appropriate depending on a wavelength of a light source used. For example, initiating systems disclosed in paragraph numbers from [0021] to [0023] in JP 2001-22079 A are preferred.

The high molecular weight binder is supposed not only to function as a film forming agent for the photopolymerization type photosensitive composition but also to dissolve the image recording layer in the alkaline developer. Accordingly, an organic high molecular weight polymer having solubility or a swelling property with respect to an alkaline water is used therein. As the organic high molecular weight polymer, materials disclosed in paragraph numbers from [0036] to [0063] in JP 2001-22079 A are preferred.

It is preferable that the photopolymerization type photosensitive composition of the photopolymer type contain additives (including a surfactant for improving a coating property, a colorant, a plasticizer, and a thermal polymerization inhibitor, for example) disclosed in paragraph numbers from [0079] to [0088] in JP 2001-22079.

Moreover, it is preferable to provide an oxygen impermeable protection layer on the image recording layer of the photopolymer type in order to prevent a polymerization inhibition effect of oxygen. A polymer to be contained in the oxygen impermeable protection layer may be polyvinyl alcohol and a copolymer thereof, for example.

In addition, it is also preferable to provide an intermediate layer or an adhesive layer as disclosed in paragraph numbers from [0124] to [0165] in JP 2001-228608.

<Conventional negative type>

The photosensitive composition of the conventional negative type contains diazo resin or photocrosslinkable resin. In particular, a photosensitive composition containing diazo resin and a polymer (a binder) having solubility or a swelling property with respect to an alkali is preferred.

The diazo resin may be: a condensate of an aromatic diazonium salt and an active carbonyl group-containing compound such as formaldehyde; and an organic solvent-soluble diazo resin inorganic salt which is a reaction product between a condensate of a p-diazophenylamine and formaldehyde, and, any of a hexafluorophosphate salt or a tetrafluoroborate salt, for example. Particularly, a high molecular weight diazo compound containing not less than 20 mol % of a hexamer or larger as disclosed in JP 59-78340 A is preferred.

The binder may be a copolymer which contains any of acrylic acid, methacrylic acid, crotonic acid, and maleic acid as an essential component, for example. To be more precise, the binder may be a multi-copolymer of monomers such as 2-hydroxyethyl (meta)acrylate, (meta)acrylonitrile or (meta) acrylic acid as disclosed in JP 50-118802 A, or a multi-copolymer including alkyl acrylate, (meta)acrylonitrile, and an unsaturated carboxylic acid as disclosed in JP 56-4144 A.

It is preferable that the photosensitive composition of the conventional negative type contain compounds disclosed in paragraph numbers from [0014] to [0015] in JP 7-281425 A such as a printing agent, a dye, a plasticizer for providing the coating with flexibility and abrasion resistance or a development accelerator, and a surfactant for improving a coating property, as additives.

Below the photosensitive layer of the conventional negative type, it is preferable to provide an intermediate layer disclosed in JP 2000-105462 A, which contains a polymer compound including a constituent having an acid radical and a constituent having an onium group.

<Conventional positive type>

The photosensitive composition of the conventional positive type contains a quinone diazide compound. In particular, a photosensitive composition containing an o-quinone diazide compound and an alkali-soluble polymer compound is preferred.

The o-quinone diazide compound may be an ester of 1,2-naphtoquinone-2-diazide-5-sulfonyl chloride and any of phenol-formaldehyde resin and cresol-formaldehyde resin, or an ester of 1,2-naphtoquinone-2-diazide-5-sulfonyl chloride and pyrogallol-acetone resin disclosed in U.S. Pat. No. 3,635,709, for example.

The alkali-soluble polymer compound may be phenol-formaldehyde resin, cresol-formaldehyde resin, phenol-cresol-formaldehyde cocondensed resin, polyhydroxystyrene, an N-(4-hydroxyphenyl)methacrylamide copolymer, a carboxy group-containing polymer disclosed in JP 7-36184 A, phenolic hydroxy group-containing acrylic resin disclosed in JP 51-34711 A, sulfonamide group-containing acrylic resin disclosed in JP 2-866 A, or urethane resin, for example.

It is preferable that the photosensitive composition of the conventional positive type contain compounds disclosed in paragraph numbers from [0024] to [0027] in JP 7-92660 A such as a sensitivity adjuster, a printing agent or a dye, and a surfactant disclosed in paragraph number [0031] in JP 7-92660 A for improving a coating property, as additives.

Below the photosensitive layer of the conventional positive type, it is preferable to provide an intermediate layer which is similar to the above-described intermediate layer preferably used in the conventional negative type.

<Non-treatment type>

The photosensitive composition of the non-treatment type includes thermoplastic fine-particle polymer type, a microcapsule type, a sulfonic acid generating polymer containing type. All of these are included in the thermosensitive type containing the photothermal conversion material. It is preferable that the photothermal conversion material be a dye similar to the one used in the above-described thermal positive type.

The photosensitive composition of the thermoplastic fine-particle polymer type is formed by dispersing a hydrophobic and thermofusible fine-particle polymer in a hydrophilic polymer matrix. On an image recording layer of the thermoplastic fine-particle polymer type, hydrophobic polymer fine particles are fused by heat generated through light exposure and bond together to form a hydrophobic area, namely, the image area.

As for the fine particle polymer, it is preferable that the fine particles be fused by heat to cohere and have a hydrophilic surface so that the polymer can be disposed in a hydrophilic component such as a fountain solution. To be more precise, thermoplastic fine-particle polymers disclosed in Research Disclosure No. 33303 (January 1992), JP 9-123387 A, JP 9-131850 A, JP 9-171249 A, JP 9-171250 A, EP 931647 A, and the like are preferred. Among these polymers, polystyrene and methyl polymethacrylate are preferred. The fine-particle polymer having the hydrophilic surface may be: a polymer which is hydrophilic by nature; a fine-particle polymer modified to be hydrophilic by attaching a hydrophilic compound such as polyvinyl alcohol or polyethylene glycol onto a surface thereof, for example.

It is preferable that the fine-particle polymer has a reactive functional group.

Preferable photosensitive compositions of the microcapsule type include a composition as disclosed in JP 2000-118160 A and a composition of the microcapsule type that includes a compound having a heat-reactive functional group as disclosed in JP 2001-277740 A.

The sulfonic acid generating polymer used in the photosensitive composition of the sulfonic acid generating polymer containing type may be a polymer with a side chain having any of a sulfonic ester group, disulfone group, and sec- or tert-sulfonamide group as disclosed in JP 10-282672 A, for example.

By combining hydrophilic resin with the photosensitive composition of the non-treatment type, the development property on a printing machine is improved; and moreover, film strength of the photosensitive layer is also enhanced. As for the hydrophilic resin, it is preferable to use resin having a hydrophilic group such as a hydroxy group, a carboxy group, hydroxyethyl group, a hydroxypropyl group, an amino group, an aminoethyl group, an aminopropyl group or a carboxymethyl group, or sol-gel conversion binder resin, for example.

The image recording layer of the non-treatment type can be developed on a printing machine without requiring a special developing process. As a method of manufacturing the image recording layer of the non-treatment type and a plate making method, it is possible to use methods described in detail in JP 2002-178655 A.

<Back coating>

It is possible to provide a covering layer made of an organic polymer on a rear surface of the presensitized plate of the present invention obtained by providing a variety of image recording layers on the support for a lithographic printing plate of the present invention as appropriate, in order to prevent scratches on the image recording layer which may be caused by stacking.

(Plate making method (method of manufacturing lithographic Printing Plate))

The presensitized plate using the support for a lithographic printing plate obtained by the present invention will be further formed into a lithographic printing plate in accordance with various treatment methods depending on the image recording layer.

A light source for an active light beam for use in image exposure may be a mercury lamp, a metal halide lamp, a xenon lamp, or a chemical lamp, for example. A laser beam may be a helium-neon laser (a He—Ne laser), an argon laser, a krypton laser, a helium-cadmium laser, a KrF excimer laser, a semiconductor laser, an yttrium-aluminum-garnet (YAG) laser, or an yttrium-aluminum-garnet second-harmonic-generation (YAG-SHG) laser, for example.

When the image recording layer is any of the thermal positive type, the thermal negative type, the conventional negative type, the conventional positive type, and the photopolymer type, it is preferable to obtain the lithographic printing plate by developing the image recording layer using a developer after the light exposure.

The developer is preferably an alkaline developer or more preferably an alkaline aqueous solution which substantially contains no organic solvent.

Moreover, a developer which substantially contains no alkali metal silicate is also preferred. As a developing method using a developer substantially containing no alkali metal silicate, it is possible to use a method described in detail in JP 11-109637.

It is also possible to use a developer which contains an alkali metal silicate.

EXAMPLES

The present invention will be described in further detail by the following examples.

Examples 1 to 12, Comparative Examples 1 to 3

(1) (Relation between solid solution amounts of alloy elements and electrolytically roughened surfaces)

Aluminum materials having compositions shown in Table 1 were subjected to the intermediate annealing shown respectively in Tables 2, 3, and 4 to adjust solid solution amounts of Fe, Si, and Cu. Alloy blanks of the present invention and alloy blanks of Comparative Examples were manufactured. Then, the alloy blanks were subjected to the following surface treatments to obtain aluminum supports for a lithographic printing plate. Thereafter, uniformity of an electrolytically roughened surface of every alloy plate was evaluated.

Table 1 shows chemical compositions of various alloys of the present invention and various alloys for comparison used in this test.

TABLE 1

| Composition | Si (wt %) | Fe (wt %) | Cu (wt %) | Ti (wt %) | Others total (wt %) | Balance |
|---|---|---|---|---|---|---|
| Al-1 | 0.09 | 0.3 | 0.001 | 0.005 | 0.05 | Al |
| Al-2 | 0.04 | 0.3 | 0.010 | 0.005 | 0.05 | Al |
| Al-3 | 0.04 | 0.8 | 0.010 | 0.005 | 0.05 | Al |
| Al-4 | 0.04 | 1.0 | 0.010 | 0.005 | 0.05 | Al |
| Al-5 | 0.03 | 0.3 | 0.005 | 0.01 | 0.05 | Al |
| Al-6 | 0.03 | 0.3 | 0.015 | 0.01 | 0.05 | Al |
| Al-7 | 0.03 | 0.3 | 0.027 | 0.01 | 0.05 | Al |
| Al-8 | 0.03 | 0.3 | 0.05 | 0.01 | 0.05 | Al |
| Al-9 | 0.03 | 0.3 | 0.06 | 0.01 | 0.05 | Al |
| Al-10 | 0.06 | 0.3 | 0.002 | 0.015 | 0.05 | Al |
| Al-11 | 0.10 | 0.3 | 0.010 | 0.015 | 0.05 | Al |
| Al-12 | 0.08 | 0.3 | 0.025 | 0.015 | 0.05 | Al |

<Surface treatment: when performing electrolytic surface roughening under electrolytic surface roughening condition I>

(a) Alkaline etching

An etching treatment was carried out by spraying an aqueous solution adjusted to a caustic soda concentration of 25 wt %, an aluminum ion concentration of 100 g/L, and temperature of 60° C. from the spray tubes onto the aluminum plate. An etching amount on a surface of the aluminum plate to be subjected to an electrochemical surface roughening treatment was 5 $g/m^2$.

(b) Desmutting treatment

A desmutting treatment was carried out by spraying 1-wt % nitric acid aqueous solution at temperature of 35° C. from the spray tubes for 5 seconds.

(c) electrolytic surface roughening treatment under electrolytic surface roughening condition I Electrochemical surface roughening treatment using alternating current in nitric acid aqueous solution (first electrolytic treatment)

Then, an electrochemical surface roughening treatment was continuously carried out by use of an electrolytic solution (temperature at 50° C.) adjusted to the aluminum ion concentration of 4.5 g/L by dissolving aluminum nitrate in the 1-wt % nitric acid aqueous solution, and by use of an alternating current voltage at 60 Hz. The electrolytic current waveform is shown in FIG. 1, in which the time (TP) consumed by the current value to reach from zero to a peak was 0.8 msec., and the duty ratio (ta/T, a ratio of anodic reaction time in one cycle) was 0.5. A carbon electrode was used as a counter electrode. Ferrite was used for the auxiliary anodes. Two tanks were used as the electrolytic tanks as shown in FIG. 2.

In the electrochemical surface roughening treatment, current density of the aluminum plate in the course of the anodic reaction at the peak of the alternating current was 60 $A/dm^2$. A ratio between a total quantity of electricity at the anodic reaction and a total quantity of electricity at the cathodic reaction of the aluminum plate was 0.95. The total quantity of electricity at the anodic reaction of the aluminum plate was 190 $C/dm^2$. 5% of the current flowing from the power source was shunted to the auxiliary anodes. A relative velocity between the aluminum plate and the electrolytic solution was 1.5 m/sec on an average inside the electrolytic tanks.

(d) Alkaline etching

An etching treatment was carried out by spraying an aqueous solution adjusted to a caustic soda concentration of 5 wt %, an aluminum ion concentration of 5 g/L, and temperature of 35° C. from the spray tubes onto the aluminum plate. An etching amount on the surface of the aluminum plate subjected to the electrochemical surface roughening treatment was 0.1 $g/m^2$.

(e) Desmutting treatment

A desmutting treatment was carried out by spraying an aqueous solution having a sulfuric acid concentration of 300 g/L, an aluminum ion concentration of 5 g/L, and temperature of 35° C. from the spray tubes for 5 seconds.

(f) The water washing treatment was carried out between the above-described respective treatments.

The solid solution amounts and uniformity of the electrolytically roughened surfaces of the obtained supports were measured in accordance with the conditions described below. Results are shown in Tables 2, 3, and 4.

<Evaluation of the uniformity of the electrolytically roughened surfaces>

The surfaces after the electrolytic surface roughening treatments were observed (at 2000-fold magnification) with a scanning electron microscope (SEM: 5500 made by JEOL Ltd.) to evaluate graining uniformity. Results are shown in Tables 2 to 6 and 8.

A: round pits accounted for 90% or above

B: round pits accounted for a range equal to or above 50% but below 90%

C: round pits accounted for a range equal to or above 10% but below 50%

D: round pits accounted for less than 10%

<Measurement of solid solution amounts and uniformity>

Relations between the solid solution amounts of the alloy elements and the uniformity of the electrolytically roughened surfaces were compared between the alloy blanks of the present invention and the alloy blanks of the comparative examples as obtained by the above-described processes.

<Measurement of solid solution amounts of Fe, Si, and Cu>

The solid solution amounts were measured in accordance with the phenol dissolution and extraction method. Samples were dissolved in heated phenol and then benzyl alcohol was added thereto. Intermetallic compound residues were filtered out from the samples by use of a polytetrafluoroethylene filter. After dilution with benzyl alcohol, Fe, Si, and Cu contained in the solution were extracted and the solid solution amounts thereof were measured by the standard addition inductively coupled plasma (ICP) emission spectrometry.

<Surface treatment: when performing electrolytic surface roughening under electrolytic surface roughening condition II>

The blanks obtained in the same manner were subjected to brush graining in slurry of pumice stone (grain size 30 μm (median diameter)/water (specific gravity 1.5), and then to (a) the alkaline etching (amount of aluminum dissolved: 0.3 $g/m^2$) and (b) the desmutting treatment (1% nitric acid solution, 30° C., 10 seconds). Thereafter, the electrolytic surface roughening treatment was carried out in the 1% nitric acid by use of a power source having a polarity-alternating electrolytic waveform so that the amount of electricity at the anodic reaction can be 190 $c/dm^2$. After washing in sulfuric acid (sulfuric acid concentration 300 g/L, 60° C., 3 seconds), the uniformity of electrolytically roughened surfaces were measured in the same manner.

<Evaluation of uniformity of electrolytically roughened surfaces>

The uniformity of the electrolytically roughened surfaces were evaluated in the same method as that applied to the supports obtained by the surface treatment when performing the electrolytic surface roughening under the electrolytic surface roughening condition I. Results are shown in Tables 2 to 4. In the Tables, a column Condition I shows the case in which the surface treatment including the electrolytic surface roughening treatment I is performed, and a column Condition II shows the case in which the surface treatment including the electrolytic surface roughening treatment II is performed.

TABLE 2

| | Al composition | Si solid solution amount (ppm) | Uniformity of electrolytically roughened surface Condition I | Condition II | Intermediate annealing condition |
|---|---|---|---|---|---|
| Example 1 | Al-1 | 150 | C | C | 330° C. × 10 hr. |
| Example 2 | Al-1 | 200 | B, C | B, C | 400° C. × 10 hr. |
| Example 3 | Al-1 | 800 | B | B | 550° C. × 10 hr. |
| Comparative Example 1 | Al-1 | 100 | D | D | 280° C. × 10 hr. |

TABLE 3

| | Al composition | Fe solid solution amount (ppm) | Si solid solution amount (ppm) | Uniformity of electrolytically roughened surface Condition I | Condition II | Intermediate annealing condition |
|---|---|---|---|---|---|---|
| Example 4 | Al-2 | 200 | 150 | C | C | 350° C. × 10 hr. |
| Example 5 | Al-2 | 300 | 150 | B | B | 400° C. × 10 hr. |
| Example 6 | Al-2 | 500 | 150 | B | B | 450° C. × 10 hr. |
| Example 7 | Al-3 | 1300 | 150 | B | B | 500° C. × 10 hr. |
| Example 8 | Al-3 | 4000 | 150 | C | C | 550° C. × 20 hr. |
| Comparative Example 2 | Al-4 | 5000 | 150 | D | D | 550° C. × 20 hr. |

TABLE 4

| | Al composition | Cu solid solution amount (ppm) | Si solid solution amount (ppm) | Uniformity of electrolytically roughened surface Condition I | Condition II | Intermediate annealing condition |
|---|---|---|---|---|---|---|
| Example 9 | Al-5 | 50 | 150 | C | C | 400° C. × 10 hr. |
| Example 10 | Al-6 | 120 | 150 | B | B | 400° C. × 10 hr. |
| Example 11 | Al-7 | 250 | 150 | B | B | 400° C. × 10 hr. |
| Example 12 | Al-8 | 450 | 150 | C | C | 400° C. × 10 hr. |
| Comparative Example 3 | Al-9 | 550 | 150 | D | D | 400° C. × 10 hr. |

Examples 13 to 17, Comparative Examples 4 and 5

(2) (Relation between specific resistance and electrolytically roughened surfaces)

The aluminum materials having the composition Al-10 shown in Table 1 were subjected to the intermediate annealing shown in Table 5 to adjust the Si solid solution amounts. Then, aluminum supports for a lithographic printing plate were obtained by carrying out the surface treatment including the above-described electrolytic surface roughening treatment I. Thereafter, specific resistance and uniformity of the electrolytically roughened surfaces were evaluated as shown in Table 5.

Measurement condition of specific resistance

Specific resistance of each sample of the aluminum support for a lithographic printing plate subjected to the surface treatment was measured under liquid nitrogen condition.

TABLE 5

| | Al composition | Si solid solution amount (ppm) | Specific resistance (μΩmm) | Uniformity of electrolytically roughened surface | Intermediate annealing condition |
|---|---|---|---|---|---|
| Example 13 | Al-10 | 150 | 3.5 | C | 300° C. × 10 hr. |
| Example 14 | Al-10 | 150 | 4.0 | B, C | 400° C. × 10 hr. |
| Example 15 | Al-10 | 150 | 5.0 | B | 480° C. × 10 hr. |
| Example 16 | Al-10 | 200 | 6.0 | B | 520° C. × 10 hr. |
| Example 17 | Al-10 | 800 | 6.5 | C | 560° C. × 10 hr. |
| Comparative Example 4 | Al-10 | 120 | 3.0 | D | 280° C. × 10 hr. |
| Comparative Example 5 | Al-10 | 100 | 7.0 | D | 600° C. × 5 hr. |

TABLE 6

| | Al composition | Si solid solution amount (ppm) | Uniformity of electrolytically roughened surface | Visibility of woodgrain patterns on rear surface | Intermediate annealing condition |
|---|---|---|---|---|---|
| Example 18 | Al-1 | 800 | A | A | 550° C. × 10 hr. |
| Comparative Example 6 | Al-1 | 100 | C | B | 280° C. × 10 hr. |

Example 18, Comparative Example 6

(3) (Solid solution amounts of alloy elements and visibility of woodgrain patterns on rear surfaces)

The aluminum materials having the composition Al-1 shown in Table 1 were subjected to the intermediate annealing shown in Table 6 to adjust the Si solid solution amounts. Then, aluminum supports for a lithographic printing plate were obtained by carrying out the surface treatment described below. Thereafter, the Si solid solution amounts, uniformity of the electrolytically roughened surfaces, and visibility of woodgrain patterns on rear surfaces were evaluated as shown in Table 6.

<Surface treatment>

The surface treatment including the above-described electrolytic surface roughening treatment II was repeated except that (g) alkaline etching of the rear surface under the following conditions was carried out between (a) the alkaline etching and (b) the desmutting treatment.

(g) Alkaline etching of rear surface

An etching treatment was carried out by spraying an aqueous solution adjusted to a caustic soda concentration of 25 wt %, an aluminum ion concentration of 100 g/L, and temperature of 60° C. from the spray tubes onto the rear surface of the aluminum plate. An etching amount on the surface was 3 $g/m^2$.

Evaluation of visibility of woodgrain patterns on rear surfaces

A: fine (patterns visible)

B: faint (acceptable)

C: none (patterns not visible)

Examples 19 to 24, Comparative Examples 7 to 12

(4) (Solid solution amounts of alloy elements, electrolytic surface roughening conditions, and evaluation of printing performances)

The aluminum materials having the composition Al-11 shown in Table 1 were respectively subjected to intermediate annealing and the solid solution amounts were adjusted and measured. Then, aluminum supports for a lithographic printing plate were obtained by carrying out the surface treatment described below. Thereafter, the thermal positive type image recording layer described below was coated under the following conditions to form the presensitized plates. After exposure, development, and printing, printing performances (stain resistance) were evaluated as shown in Table 7.

<Surface treatment>

(a) Alkaline etching

An etching treatment was carried out by spraying an aqueous solution adjusted to a caustic soda concentration of 25 wt %, an aluminum ion concentration of 100 g/L, and temperature of 60° C. from the spray tubes onto the aluminum plate. An etching amount on a surface of the aluminum plate to be subjected to an electrochemical surface roughening treatment was 6 $g/m^2$.

(b) Desmutting treatment

A desmutting treatment was carried out by spraying 1-wt % nitric acid aqueous solution at temperature of 35° C. from the spray tubes for 5 seconds.

(c) Electrolytic surface roughening treatment

An electrochemical surface roughening treatment was continuously carried out by use of an electrolytic solution (temperature at 50° C.) adjusted to the aluminum ion concentration of 4.5 g/L by dissolving aluminum nitrate in the 1-wt % nitric acid aqueous solution, and by use of an alternating current voltage at 60 Hz. The electrolytic current waveform is shown in FIG. 1, in which the time (TP) consumed by the current value to reach from zero to a peak was set to 0.8 msec., and the duty ratio (ta/T) was set to 0.5. A carbon electrode was used as a counter electrode. Ferrite was used for the auxiliary anodes. Two tanks were used as the electrolytic tanks as shown in FIG. 2.

In the electrochemical surface roughening treatment, current density of the aluminum plate in the course of the anodic reaction at the peak of the alternating current was varied as shown in FIG. 7. A ratio between a total quantity of electricity at the anodic reaction and a total quantity of electricity at the cathodic reaction of the aluminum plate was 0.95. The total quantity of electricity at the anodic reaction of the aluminum plate was 250 C/dm$^2$. 5% of the current flowing from the power source was shunted to the auxiliary anodes. A relative velocity between the aluminum plate and the electrolytic solution was 1.5 m/sec on an average inside the electrolytic tanks.

(d) Alkaline etching

An etching treatment was carried out by spraying an aqueous solution adjusted to a caustic soda concentration of 5 wt %, an aluminum ion concentration of 5 g/L, and temperature of 35° C. from the spray tubes onto the aluminum plate. An etching amount on the surface of the aluminum plate subjected to the electrochemical surface roughening treatment was varied as shown in FIG. 7.

(e) Desmutting treatment

A desmutting treatment was carried out by spraying an aqueous solution having a sulfuric acid concentration of 15 wt %, an aluminum ion concentration of 5 g/L, and temperature of 35° C. from the spray tubes for 5 seconds.

(h) Anodic oxidation treatment

An anodic oxidation treatment was carried out by use of the anodic oxidation apparatus shown in FIG. 3.

An electrolytic solution (temperature at 33° C.) adjusted to an aluminum ion concentration of 5 g/L by dissolving aluminum sulfate in a 170-g/L sulfuric acid aqueous solution was used. The anodic oxidation treatment was performed so as to obtain an average current density of 15 A/dm$^2$ during the anodic reaction (about 16 seconds) of the aluminum plate. A final amount of an oxide film was 2.4 g/m$^2$. Here, the time consumed for the anodic reaction of the aluminum plate was 16 seconds.

(i) Silicate treatment (hydrophilic treatment)

The aluminum plate was dipped in a 1-wt % No. 3 sodium silicate aqueous solution (temperature at 20° C.) for 10 seconds. A Si amount on the surface of the aluminum plate was 3.5 mg/m$^2$ when measured by an x-ray fluorescence analyzer.

(f) The water washing treatment was carried out between the above-described respective treatments.

<Production of presensitized plate>

An image recording layer of the thermal positive type described below was provided to each support obtained by the foregoing processes to obtain a presensitized plate. Here, an undercoating layer described below was provided before providing the image recording layer.

The support for a lithographic printing plate was coated with an undercoating solution having the following composition, which was then dried at 80° C. for 15 seconds to form a coating film of the undercoating layer. A coverage amount of the coating film after drying was 15 mg/m$^2$.

<Composition of undercoating solution>

| | |
|---|---|
| *polymer compound to be described below | 0.3 g |
| 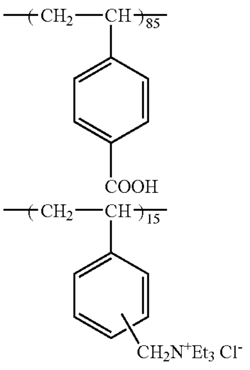 | MOLECULAR WEIGHT 28THOUSANDS |
| *methanol | 100 g |
| *water | 1 g |

Further, a heat-sensitive layer coating solution of the composition to be described below was prepared. The support for a lithographic printing plate provided with the undercoating layer was coated with the heat-sensitive coating solution so as to obtain a coating amount (a heat-sensitive layer coating amount) of 1.8 g/m$^2$ after drying. The coating solution was then dried to from the heat-sensitive layer (the image recording layer of the thermal positive type), and the presensitized plate was thereby obtained.

<Composition of heat-sensitive layer coating solution>

| | |
|---|---|
| *novolac resin (m-cresol:p-cresol = 60:40, weight-average molecular weight 7000, 0.05 wt % unreacted cresol contained) | 0.90 g |
| *ethyl metacrylate-isobutyl methacrylate-methacrylic acid copolymer (mole ratio 35:35:30) | 0.10 g |
| *a cyanine dye A expressed by the following structural formula | 0.1 g |
| CYANINE DYE A | |
| 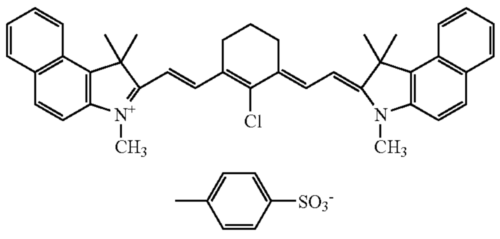 | |
| *tetrahydrophthalic anhydride | 0.05 g |
| *p-toluene sulfonic acid | 0.002 g |
| *ethyl violet modified by replacing a counter ion with 6-hydroxy-β-naphthalene sulfonic acid | 0.02 g |
| *a fluorine-based surfactant (Defensa F-780F, made by Dainippon Ink and Chemicals, solid content 30 wt %) | 0.0045 g (in solid content) |
| *a fluorine-based surfactant (Defensa F-781F, made by Dainippon Ink and Chemicals, solid content 100 wt %) | 0.035 g |
| *methylethylketone | 12 g |

Images were formed on the obtained presensitized plates by use of Trendsetter made by Creo Inc. under the conditions of a drum rotation speed of 150 rpm and a beam intensity of 10 W. Thereafter, the presensitized plates were developed for 20 seconds by PS Processor 940H available from Fuji Photo Film Co., Ltd. containing an alkaline developer having the following composition while maintaining the developer at 30° C. Lithographic printing plates were thus obtained.

<Composition of alkaline developer>

| | |
|---|---|
| D-sorbit | 2.5 wt % |
| sodium hydroxide | 0.85 wt % |
| polyethyleneglycol lauryl ether (weight-average molecular weight 1000) | 0.5 wt % |
| water | 96.15 wt % |

Evaluation of printing performance (stain resistance)

The obtained lithographic printing plates were set on Mitsubishi DAIYA F2 Press (available from Mitsubishi Heavy Industries, Ltd.) for printing by use of red ink DIC-GEOS (s). After printing 10000 sheets, stains on each blanket were evaluated visually.

Results are shown in Table 7. Evaluation was based on the following criteria.

A: no stains on the blanket

B: very few stains on the blanket

C: a few stains on the blanket

D: the blanket is stained but is still acceptable

E: the blanket is stained and a printed sheet is apparently stained

F: considerable stains on the blanket

G: serious stains on the blanket

TABLE 7

| | Al composition | Si solid solution amount (ppm) | Current density ($A/dm^2$) | Alkaline etching amount ($g/m^2$) | Stain resistance | Intermediate annealing condition |
|---|---|---|---|---|---|---|
| Example 19 | Al-11 | 600 | 5 | 0.1 | D | 500° C. × 10 hr. |
| Example 20 | Al-11 | 600 | 7 | 0.1 | B | 500° C. × 10 hr. |
| Example 21 | Al-11 | 600 | 20 | 0.1 | A | 500° C. × 10 hr. |
| Example 22 | Al-11 | 600 | 5 | 0.2 | C | 500° C. × 10 hr. |
| Example 23 | Al-11 | 600 | 7 | 0.2 | B | 500° C. × 10 hr. |
| Example 24 | Al-11 | 600 | 20 | 0.2 | A | 500° C. × 10 hr. |
| Comparative Example 7 | Al-11 | 600 | 5 | 0 | E | 500° C. × 10 hr. |
| Comparative Example 8 | Al-11 | 600 | 7 | 0 | E | 500° C. × 10 hr. |
| Comparative Example 9 | Al-11 | 600 | 20 | 0 | E | 500° C. × 10 hr. |
| Comparative Example 10 | Al-11 | 140 | 5 | 0.1 | G | 300° C. × 10 hr. |
| Comparative Example 11 | Al-11 | 140 | 7 | 0.1 | G | 300° C. × 10 hr. |
| Comparative Example 12 | Al-11 | 140 | 20 | 0.1 | F | 300° C. × 10 hr. |

Examples 25 to 28

(5) (Solid solution amounts of alloy elements, electrolytic surface roughening conditions, and evaluation of printing performances)

The aluminum materials having the composition Al-12 shown in Table 1 were respectively subjected to intermediate annealing and the solid solution amounts were adjusted and measured. Then, aluminum supports for a lithographic printing plate were obtained by carrying out the surface treatment described below. Thereafter, the thermal positive type image recording layer similar to the one used in the previous evaluation of printing performances was formed under the same conditions to obtain the presensitized plates. After exposure, development, and printing in the same manner, printing performances (stain resistance) were evaluated as shown in Table 8.

<Surface treatment>

The surface treatment processes (a) to (f) in the test (4) were repeated except that the following conditions were applied to (c) the electrolytic surface roughening treatment and (d) the alkaline etching.

(c) Electrolytic surface roughening treatment

The electrolytic surface roughening treatment was carried out as described in the process (c) in the previous test (4), except that the current density was 20 $A/dm^2$, that a 1-wt % nitric acid aqueous solution or a 1-wt % hydrochloric acid aqueous solution was used as the electrolytic solution as shown in Table 8, and that a trapezoidal wave or a sinusoidal wave was selected as the electrolytic current waveform as shown in Table 8.

(d) Alkaline etching

The etching treatment was carried out by spraying the aqueous solution adjusted to the caustic soda concentration of 5 wt %, the aluminum ion concentration of 5 g/L, and the temperature of 35° C. from the spray tubes onto the aluminum plate. The etching amount on the surface of the aluminum plate subjected to the electrochemical surface roughening treatment was 0.2 $g/m^2$.

TABLE 8

| | Al composition | Si solid solution amount* (ppm) | Electrolytic solution | Electrolytic current waveform | Quantity of electricity ($C/dm^2$) | Uniformity of electrolytically roughened surface | Stain resistance |
|---|---|---|---|---|---|---|---|
| Example 25 | Al-12 | 150 | 1-wt % nitric acid | trapezoidal | 250 | A | A |
| Example 26 | Al-12 | 150 | 1-wt % nitric acid | sinusoidal | 250 | C | D |
| Example 27 | Al-12 | 150 | 1-wt % hydrochloric acid | trapezoidal | 250 | B | B |
| Example 28 | Al-12 | 150 | 1-wt % hydrochloric acid | sinusoidal | 250 | A | A |

*Heat treatment condition: the solid solution amounts were adjusted under the condition of 450° C. × 5 hr.

Examples 29 to 31

(6) (Solid solution amounts of alloy elements, electrolytic surface roughening conditions, and evaluation of printing performances)

The aluminum materials having the composition Al-12 shown in Table 1 were respectively subjected to intermediate annealing to adjust the solid solution amounts. Then, aluminum supports for a lithographic printing plate were obtained by carrying out the surface treatment described below. Thereafter, the thermal positive type image recording layer similar to the one used in the previous evaluation of printing performances was formed under the same conditions to obtain the presensitized plates. After exposure, development, and printing in the same manner, printing performances (stain resistance) were evaluated as shown in Table 9.

<Surface treatment>

The surface treatments in the test (4) were repeated except that (j) a brush graining treatment was first carried out under the following conditions, and that the following conditions were applied to (c) the electrolytic surface roughening treatment and (d) the alkaline etching.

(j) Brush graining treatment

Mechanical surface roughening was carried out by use of slurry obtained by suspending pumice stone (median diameter: 30 μm) having the specific gravity of 1.13 in water as polishing slurry, and by use of a laminated brush roll having a bristle diameter of 0.3 mm, so as to obtain Ra after the subsequent alkaline etching of 0.45 μm.

(c) Electrolytic surface roughening treatment

In Examples 29 and 30, only (c) first electrolytic surface roughening was carried out as shown in FIG. 9. Then, (d) the alkaline etching was subsequently carried out.

In Example 31, (c)-2 second electrolytic surface roughening was carried out after the alkaline etching following (c) the first electrolytic surface roughening. Then, (d) the alkaline etching was carried out again. This is as shown in FIG. 9.

Evaluation of press life

The obtained presensitized plates were used in the test (4). Thereafter, images were formed in the same manner.

Then, the presensitized plates were developed in a similar processor containing a similar developer under similar conditions, and lithographic printing plates were thereby obtained.

The obtained lithographic printing plates were set on Lithrone Press (available from Komori Corporation) for printing by use of black ink DIC-GEOS(N) (available from Dainippon Ink and Chemicals). Press life was evaluated by the number of printed sheets at the point in time when it was visually detected that a solid image started fading. The number of the printed sheets representing press life was 50000 sheets in Example 29 and Example 31. Accordingly, 50000 sheets were redefined as 100, and the press life was indicated by relative values. Results are shown in Table 9.

TABLE 9

| | Al composition | Si solid solution amount* (ppm) | (c) First electrolytic surface roughening | (d)-2 Alkaline etching | (c)-2 Second electrolytic surface roughening | (d) Alkaline etching | Stain resistance | Press like |
|---|---|---|---|---|---|---|---|---|
| Example 29 | Al-12 | 700 | 1-wt % nitric acid quantity of electricity 250 $C/dm^2$ | no | no | amount of Al dissolved: 0.1 $g/m^2$ | C | 100 |
| Example 30 | Al-12 | 700 | 1-wt % hydrochloric acid quantity of electricity 250 $C/dm^2$ | no | no | amount of Al dissolved: 0.1 $g/m^2$ | B | 80 |
| Example 31 | Al-12 | 700 | 1-wt % nitric acid quantity of electricity | amount of Al dissolved: 3 $g/m^2$ | 0.5-wt % hydrochloric acid quantity of | amount of Al dissolved: 0.1 $g/m^2$ | A | 100 |

TABLE 9-continued

| Al composition | Si solid solution amount* (ppm) | (c) First electrolytic surface roughening | (d)-2 Alkaline etching | (c)-2 Second electrolytic surface roughening | (d) Alkaline etching | Stain resistance | Press like |
|---|---|---|---|---|---|---|---|
| | | 200 $C/dm^2$ | | electricity 63 $C/dm^2$ | | | |

*The solid solution amounts were adjusted under the heat treatment condition of 550° C. × 10 hr.

What is claimed is:

1. An aluminum alloy blank for a lithographic printing plate made of a continuously cast flat-rolled aluminum alloy plate, the aluminum alloy blank for a lithographic printing plate comprising:

iron in a range of 0.20 to 0.80 wt %; and the balance being aluminum, up to 0.05 wt % of titanium and/or up to 0.02 wt % of boron as a crystal grain refining element, and unavoidable impurity elements, wherein, the unavoidable impurity elements comprise silicone and copper, a content of silicon is in a range of 0.02 to 0.30 wt %, and a content of copper is equal to or below 0.05 wt %, and a solid solution amount of silicon is in a range of 150 ppm to 1500 ppm and a solution amount of iron is in a range of 300 ppm to 1300 ppm.

2. The aluminum alloy blank for a lithographic printing plate according to claim 1, wherein the blank has a resistivity as measured at liquid nitrogen temperature in a range of 6.5 to 3.5 μΩmm.

3. A support for a lithographic printing plate, wherein the support for a lithographic printing plate is formed by performing a surface roughening treatment including an electrochemical surface roughening on an aluminum alloy blank for a lithographic printing plate according to claim 1.

4. The support for a lithographic printing plate according to claim 3, wherein the surface roughening treatment including the electrochemical surface roughening comprises the processes of:

performing a first electrochemical surface roughening treatment using a total quantity of electricity in a range of 65 to 500 $C/dm^2$ upon an anodic reaction in the electrolytic solution containing nitric acid;

alkaline etching not less than 0.1 $g/m^2$ of aluminum;

performing a second electrochemical surface roughening treatment using a total quantity of electricity in a range of 25 to 100 $C/dm^2$ upon an anodic reaction in the electrolytic solution containing hydrochloric acid; and alkaline etching not less than 0.03 $g/m^2$ of aluminum.

5. The aluminum alloy blank for a lithographic printing plate according to claim 1, wherein aluminum alloy blank for a lithographic printing plate is formed by the step comprising an intermediate annealing at 300° C. to 600° C. for 5 to 20 hours.

6. A presensitized plate comprising:

a recording layer on one surface of a support for a lithographic printing plate according to claim 3.

7. A presensitized plate comprising:

a recording layer on one surface of a support for a lithographic printing plate according to claim 3; and a woodgrain pattern or a stripe pattern on the other surface thereof.

* * * * *